(12) United States Patent
Han et al.

(10) Patent No.: US 12,144,123 B2
(45) Date of Patent: Nov. 12, 2024

(54) ELECTRONIC DEVICE INCLUDING COIN-CELL BATTERY

(71) Applicant: Samsung Electronics Co., Ltd., Suwon-si (KR)

(72) Inventors: Kiwook Han, Suwon-si (KR); Sunghwa Park, Suwon-si (KR); Chulhan Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 127 days.

(21) Appl. No.: 17/957,697

(22) Filed: Sep. 30, 2022

(65) Prior Publication Data

US 2023/0109385 A1 Apr. 6, 2023

Related U.S. Application Data

(63) Continuation of application No. PCT/KR2022/014783, filed on Sep. 30, 2022.

(30) Foreign Application Priority Data

Oct. 1, 2021 (KR) .................. 10-2021-0130728
Mar. 11, 2022 (KR) .................. 10-2022-0030658

(51) Int. Cl.
*H05K 3/34* (2006.01)
*H04R 25/00* (2006.01)
(Continued)

(52) U.S. Cl.
CPC ............. *H05K 3/34* (2013.01); *H04R 25/602* (2013.01); *H05K 1/14* (2013.01); *H05K 1/181* (2013.01);
(Continued)

(58) Field of Classification Search
CPC ...... H04R 25/602; H04R 1/10; H04R 1/1025; H04R 2225/31; H05K 3/34; H05K 1/14;
(Continued)

(56) References Cited

U.S. PATENT DOCUMENTS

| 5,593,604 A | 1/1997 | Beasley et al. |
| 8,269,140 B2 | 9/2012 | Matsushita |

(Continued)

FOREIGN PATENT DOCUMENTS

| JP | H10-022035 A | 1/1998 |
| JP | H10-294544 A | 11/1998 |

(Continued)

OTHER PUBLICATIONS

International Search Report and written opinion dated Jan. 9, 2023, issued in International Application No. PCT/KR2022/014783.

(Continued)

*Primary Examiner* — Tuan D Nguyen
(74) *Attorney, Agent, or Firm* — Jefferson IP Law, LLP

(57) ABSTRACT

An electronic device including a coin-cell battery is provided. The electronic device further includes a housing, a battery comprising a first surface, a second surface, and a third surface, a first electrode disposed in the first surface and a second electrode disposed in the second surface, a first electrode tap, a second electrode tap, and a printed circuit board connecting the first electrode tap to the second electrode tap of the battery on the third surface. Soldering parts are formed on a first surface of the printed circuit board to connect an end of the first electrode tap to a first contact portion of the printed circuit board and an end of the second electrode tap to a second contact portion of the printed circuit board, respectively. A solder flow control member is formed on a second surface of the printed circuit board.

20 Claims, 14 Drawing Sheets

(51) Int. Cl.
*H05K 1/14* (2006.01)
*H05K 1/18* (2006.01)

(52) U.S. Cl.
CPC ....... *H05K 1/189* (2013.01); *H05K 2201/042* (2013.01); *H05K 2201/10037* (2013.01); *H05K 2201/10643* (2013.01)

(58) Field of Classification Search
CPC ............ H05K 1/181; H05K 2201/042; H05K 2201/10037; H05K 2201/10643; H05K 3/3447; H05K 2201/10303; H05K 1/189; H01M 10/42; H01M 50/202; H01M 50/247; H01M 50/284; H01M 50/559; G06F 1/16; Y02E 60/10
See application file for complete search history.

(56) References Cited

U.S. PATENT DOCUMENTS

| | | |
|---|---|---|
| 9,451,710 B2 | 9/2016 | Park |
| 2002/0090102 A1 | 7/2002 | Madaffari et al. |
| 2005/0287423 A1 | 12/2005 | Yeh |
| 2008/0236880 A1 | 10/2008 | Ozaki et al. |
| 2009/0101397 A1 | 4/2009 | Kuo et al. |
| 2015/0155545 A1 | 6/2015 | Baek |
| 2017/0118558 A1 | 4/2017 | Renken et al. |
| 2017/0134869 A1 | 5/2017 | Renken et al. |
| 2019/0289383 A1 | 9/2019 | Chawan et al. |
| 2020/0220227 A1* | 7/2020 | Kwak ................. H01M 50/287 |
| 2020/0335856 A1 | 10/2020 | Kim et al. |
| 2021/0135300 A1 | 5/2021 | Sueyoshi et al. |
| 2021/0378096 A1* | 12/2021 | Ju ......................... H05K 1/147 |

FOREIGN PATENT DOCUMENTS

| | | |
|---|---|---|
| JP | 2002-534933 A | 10/2002 |
| JP | 2004-165537 A | 6/2004 |
| JP | 3832397 B2 | 10/2006 |
| JP | 2008-244234 A | 10/2008 |
| JP | 2017-521928 A | 8/2017 |
| JP | 2018-174123 A | 11/2018 |
| KR | 20-1999-0019440 U | 6/1999 |
| KR | 10-1479306 B1 | 1/2015 |
| KR | 10-2016-0077755 A | 7/2016 |
| KR | 10-1654997 B1 | 9/2016 |
| KR | 10-2075779 B1 | 2/2020 |

OTHER PUBLICATIONS

European Search Report dated Sep. 19, 2024, issued in European Application No. 22876953.5.

* cited by examiner

ELECTRONIC DEVICE INCLUDING COIN-CELL BATTERY

CROSS-REFERENCE TO RELATED APPLICATION(S)

This application is a continuation application, claiming priority under § 365(c), of an International application No. PCT/KR2022/014783, filed on Sep. 30, 2022, which is based on and claims the benefit of a Korean patent application number 10-2021-0130728, filed on Oct. 1, 2021, in the Korean Intellectual Property Office, and of a Korean patent application number 10-2022-0030658, filed on Mar. 11, 2022, in the Korean Intellectual Property Office, the disclosure of each of which is incorporated by reference herein in its entirety.

TECHNICAL FIELD

The disclosure relates to an electronic device including a coin-cell battery.

BACKGROUND ART

At least one sound effect-related component may be disposed in an electronic device. A component related to sound effects may be, for example, a speaker, and such a component may have various shapes and arrangement structures in a housing of the electronic device according to the arrangement relationship between other components such as a battery, and/or the exterior of the electronic device, which is variously designed. An electronic device including a speaker may include a wearable electronic device, such as wireless earphones or a hearing aid, which may be worn on the portion near user's ears. The wearable electronic device may further include a microphone disposed inside the housing to perform an active noise cancellation (ANC) function.

A wearable electronic device including a speaker may be used in connection with other electronic devices. Accordingly, the wearable electronic device may be equipped with an antenna for performing wireless communication with an external electronic device and implement true wireless stereo (TWS) technology to allow the user to pursue all levels of comfort, as well as to improve the sound quality of wireless earphones such as the ANC function, using the antenna. In order to implement TWS technology, the wearable electronic device may have a battery having a larger capacity and a higher energy density.

According to an embodiment, a cylindrical battery or a coin-cell battery may be used to supply power to an electronic device having a small size. Since the coin-cell battery can be manufactured to have a significantly smaller volume than the cylindrical battery, the use of the coin-cell battery may increase the degree of freedom in design of electronic devices and meet the requirements for miniaturization/compactness required for electronic devices.

The above information is presented as background information only to assist with an understanding of the disclosure. No determination has been made, and no assertion is made, as to whether any of the above might be applicable as prior art with regard to the disclosure.

DETAILED DESCRIPTION OF THE INVENTION

Technical Problem

In the case of including a coin-cell battery in a wearable electronic device, the coin-cell battery may be formed to have an overlapping structure with other electronic components included in a housing. For example, the coin-cell battery may have an overlapping structure with a speaker and/or a microphone, various conductive circuits provided to input/output electrical signals to the speaker and/or microphone, a circuit board on which a conductive circuit is printed (hereinafter, referred to as a "printed circuit board"), and various electronic components including a power management circuit (protection circuit module (PCM)/battery management system (BMS)) for protecting the circuits and/or managing power of a battery.

As a method for reducing the volume/size of an electronic device, the height of the electronic device may be reduced by arranging a board for implementing electrical connections with various electronic components disposed above and/or below the coin-cell battery on the side of the battery. According to an embodiment, openings for receiving electrode taps connected to one surface and the opposite surface of the battery may be formed in the board disposed on the side of the battery, and the electrode taps are received inside the openings and soldered, thereby realizing electrical connections.

During the soldering process, solder may flow between the board and the electrode taps. In this case, if the amount of solder is not precisely controlled, excessive solder may flow between the board and the electrode taps to increase the temperature above the range in which the safety of the battery is guaranteed or to damage the battery and/or structures therearound. In addition, the damaged structure may result in a portion having an insufficient amount of solder for connecting the board and the electrode taps, causing incomplete electrical connections between the battery and the electronic components. For example, when the product heats up excessively or is subjected to an impact, the solder may fall off and break off the electrical connection.

Aspects of the disclosure are to address at least the above-mentioned problems and/or disadvantages and to provide at least the advantages described below. Accordingly, an aspect of the disclosure is to provide an electronic device capable of managing solder flowing between a board and an electrode tap in the process of connecting the board to the side of the coin-cell battery.

Meanwhile, even after soldering between the board and the electrode tap, the soldering portion may be separated from the electrode tap when an external physical impact is applied thereto during or after assembly of the electronic device.

Another aspect of the disclosure is to provide an electronic device capable of preventing separation of an electrode tap and a soldering portion after soldering.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a housing, a battery disposed in the inner space of the housing and comprising a first surface directed in a first direction, a second surface directed in a second direction different from the first direction, and a third surface directed in a third direction different from the first direction and the second direction, a first electrode disposed on the first surface and the electrode disposed on the second surface, a first electrode tap extending from the first surface of the battery so as to be at least partially parallel to the first surface, a second electrode tap extending from the second surface of the battery so as to be at least partially parallel to the second surface, and a printed circuit board configured to connect the first electrode tap and the second electrode tap of the battery on the third surface, wherein soldering parts are formed on a first surface of the printed circuit board, which is directed in a direction parallel to the third direction, to connect an end of the first electrode tap to a first contact portion of the printed circuit board and an end of the second electrode tap to a second contact portion of the printed circuit board, respectively, and wherein a solder flow control member is formed on a second surface of the printed circuit board, which is directed in a direction opposite the third direction.

In accordance with another aspect of the disclosure, an electronic device is provided. The electronic device includes a housing, a battery disposed in the inner space of the housing and comprising a first surface directed in a first direction, a second surface directed in a second direction different from the first direction, and a third surface directed in a third direction different from the first direction and the second direction, a first electrode disposed on the first surface and a second electrode disposed on the second surface, a first electrode tap extending from the first surface of the battery so as to be at least partially parallel to the first surface, a second electrode tap extending from the second surface of the battery so as to be at least partially parallel to the second surface, a printed circuit board configured to connect with the first electrode tap and the second electrode tap on the third surface of the battery, and a peripheral member surrounding at least a portion of the third surface of the battery, wherein soldering parts are formed on a first surface of the printed circuit board, which is directed in a direction parallel to the third direction, to connect an end of the first electrode tap to a first contact portion of the printed circuit board and an end of the second electrode tap to a second contact portion of the printed circuit board, respectively, wherein a solder flow control member is formed on a second surface of the printed circuit board, which is directed in a direction opposite the third direction, and wherein a heat-resistant tape is formed at a position corresponding to the second electrode tap on one surface of the peripheral member.

Advantageous Effects

According to an embodiment of the disclosure, it is possible to provide an electronic device having a coin-cell battery in an overlapping structure with other components and capable of reducing the volume/size of the electronic device by implementing electrical connections between electrodes (anode and cathode) of the coin-cell battery and a board on the side of the coin-cell battery.

According to an embodiment of the disclosure, it is possible to provide an electronic device capable of controlling a flow of solder between a board and an electrode tap in a soldering process for an electrical connection between an electrode of a coin-cell battery and a printed circuit board.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which.

MODE FOR CARRYING OUT THE INVENTION

Figure 1:
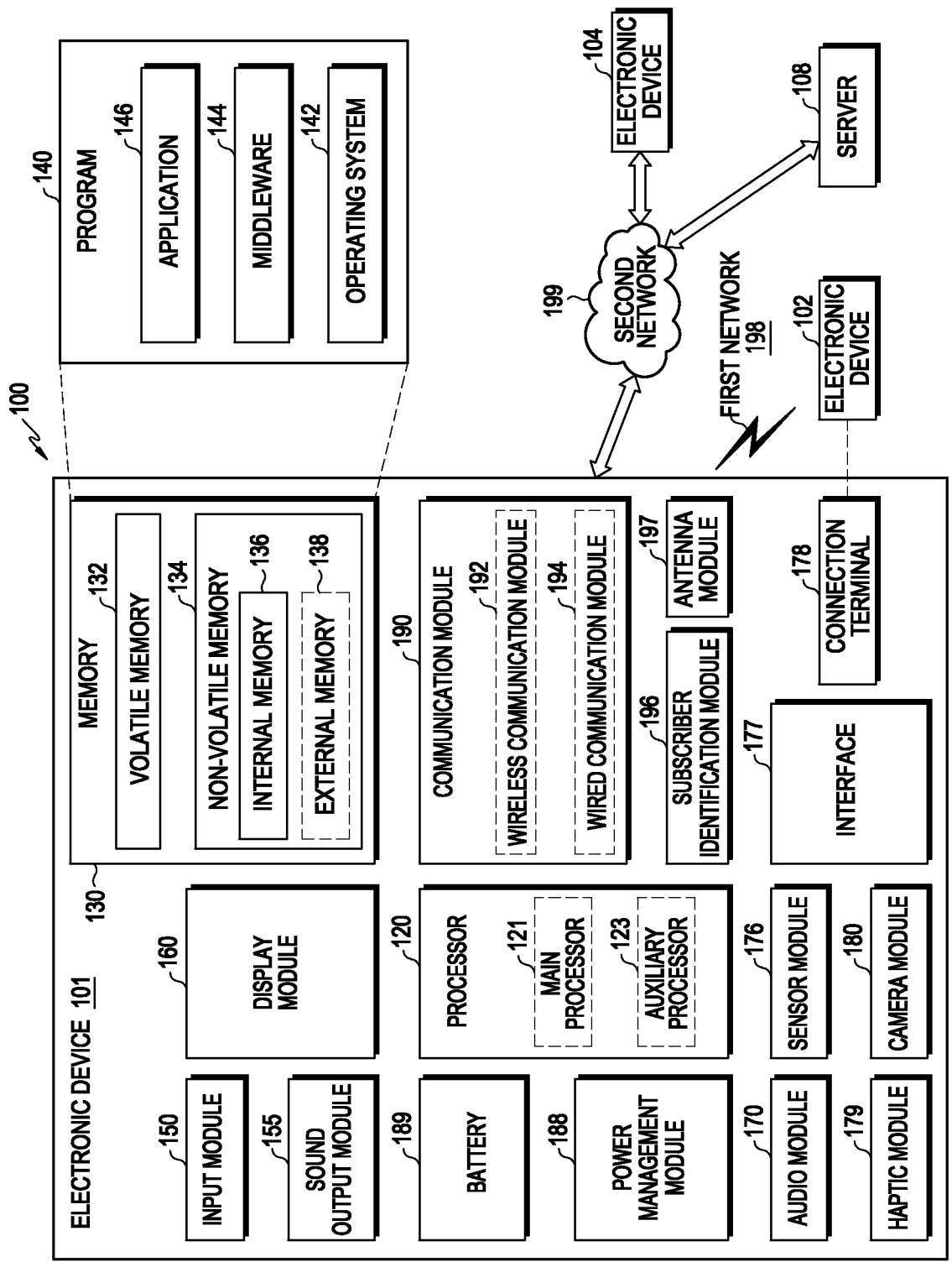
FIG. 1 is a block diagram of an electronic device in a network environment according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The embodiments described below are provided so that those skilled in the art can easily understand the technical spirit of the disclosure and are not intended to limit the disclosure. In addition, the elements in the accompanying drawings are schematically expressed in order to easily explaining the embodiments of the disclosure and may be different from those actually implemented. Before describing various embodiments of the disclosure in detail, it will be understood that application of the disclosure is not limited to the details of the configurations and arrangements of elements described in the following detailed description or shown in the drawings. In addition, if it is mentioned that a certain element is connected or combined to another element, it may be directly connected or combined to another element, but it should be understood that another element may be interposed therebetween. In addition, "connection" herein includes direct connection and indirect connection between one member and another member, and may refer to all physical connections and electrical connections such as adhesion, attachment, fastening, bonding, coupling, and the like.

Terms used in the disclosure are merely used to describe specific embodiments, and are not intended to limit the disclosure. In the disclosure, terms such as "comprise" or "have" are intended to specify that features, numbers, steps, operations, elements, and components described in the specification, or combinations thereof exist, and are not intended to preclude the possibility of addition or existence of one or more other features, numbers, steps, operations, elements, components, or combinations thereof.

FIG. 1 is a block diagram illustrating an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or at least one of an external electronic device 104 or a server 108 via a second network 199 (e.g., a long-range wireless communication network). According to an embodiment, the electronic device 101 may communicate with the external electronic device 104 via the server 108. According to an embodiment, the electronic device 101 may include a processor 120, a memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identification module (SIM) 196, or an antenna module 197. In some embodiments, at least one of the components (e.g., the connection terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence model is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., the external electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly or wirelessly. According to an embodiment, the interface 177 may include, for example, a high definition multimedia interface (HDMI), a universal serial bus (USB) interface, a secure digital (SD) card interface, or an audio interface.

The connection terminal 178 may include a connector via which the electronic device 101 may be physically connected with the external electronic device (e.g., the external electronic device 102). According to an embodiment, the connection terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5th generation (5G) network, a next-generation communication network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4th generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the external electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to an embodiment, the antenna module 197 may form an mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more of the external electronic devices 102 and 104 or the server 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
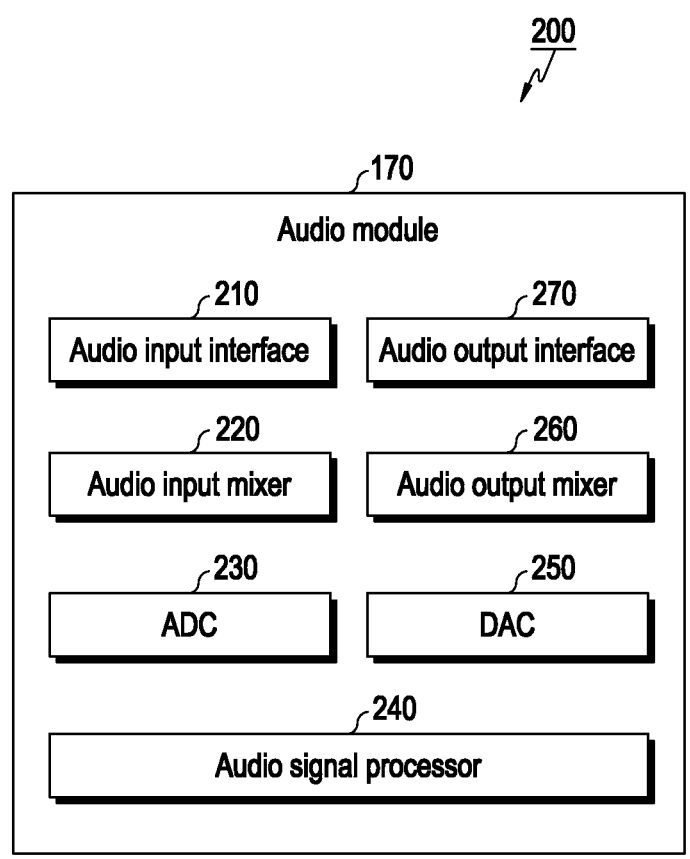
FIG. 2 is a block diagram of an audio module according to an embodiment of the disclosure.

FIG. 2 is a block diagram of an audio module according to an embodiment of the disclosure.

Referring to FIG. 2, an audio module 170 of block diagram 200 may include, for example, an audio input interface 210, an audio input mixer 220, an analog-to-digital converter (ADC) 230, an audio signal processor 240, a digital-to-analog converter (DAC) 250, an audio output mixer 260, or an audio output interface 270.

Referring to FIGS. 1 and 2, the audio input interface 210 may receive an audio signal corresponding to the sound obtained from the outside of the electronic device 101 through a microphone (e.g., a dynamic microphone, a condenser microphone, or a piezo microphone) configured as a part of the input module 150 or separately from the electronic device 101. For example, if an audio signal is obtained from the external electronic device 102 (e.g., a headset or a microphone), the audio input interface 210 may receive the audio signal while being directly connected with the external electronic device 102 through the connection terminal 178 or being wirelessly connected (e.g., Bluetooth™ communication) thereto through the wireless communication module 192. According to an embodiment, the audio input interface 210 may receive a control signal (e.g., a volume control signal received through an input button) related to the audio signal obtained from the external electronic device 102. The audio input interface 210 may include a plurality of audio input channels and may receive different audio signals between corresponding audio input channels of a plurality of audio input channels. According to an embodiment, additionally or alternatively, the audio input interface 210 may receive audio signals from other elements (e.g., the processor 120 or the memory 130) of the electronic device 101.

The audio input mixer 220 may synthesize a plurality of input audio signals into at least one audio signal. For example, according to an embodiment, the audio input mixer 220 may synthesize a plurality of analog audio signals input through the audio input interface 210 into at least one analog audio signal.

The ADC 230 may convert an analog audio signal into a digital audio signal. For example, according to an embodiment, the ADC 230 may convert an analog audio signal received through the audio input interface 210 or, additionally or alternatively, an analog audio signal synthesized through the audio input mixer 220 into a digital audio signal.

The audio signal processor 240 may perform various processing on digital audio signals input through the ADC 230 or digital audio signals received from other elements of the electronic device 101. For example, according to an embodiment, the audio signal processor 240 may perform, on one or more digital audio signals, changing of a sampling rate, application of one or more filters, processing of interpolation, amplification or attenuation of all or some frequency bands, processing of noise (e.g., noise or echo reduction), changing of a channel (e.g., switching between mono and stereo), mixing, or extraction of a specified signal. According to an embodiment, one or more functions of the audio signal processor 240 may be implemented in the form of an equalizer.

The DAC 250 may convert a digital audio signal into an analog audio signal. For example, according to an embodiment, the DAC 250 may convert digital audio signals processed by the audio signal processor 240 or digital audio signals obtained from other elements (e.g., the processor 120 or the memory 130) of the electronic device 101 into analog audio signals.

The audio output mixer 260 may synthesize a plurality of audio signals to be output into at least one audio signal. For example, according to an embodiment, the audio output mixer 260 may synthesize an analog audio signal switched by the DAC 250 and another analog audio signal (e.g., an analog audio signal received through the audio input interface 210) into at least one analog audio signal.

The audio output interface 270 may output an analog audio signal converted by the DAC 250 or, additionally or alternatively, an analog audio signal synthesized by the audio output mixer 260 to the outside of the electronic device 101 through the sound output module 155. The sound output module 155 may include, for example, a speaker such as a dynamic driver or a balanced armature driver, or a receiver. According to an embodiment, the sound output module 155 may include a plurality of speakers. In this case, the audio output interface 270 may output audio signals having a plurality of different channels (e.g., stereo or 5.1 channel) through at least some of the plurality of speakers. According to an embodiment, the audio output interface 270 may output audio signals while being directly connected to the external electronic device 102 (e.g., an external speaker or a headset) through the connection terminal 178 or while being wirelessly connected thereto through the wireless communication module 192.

According to an embodiment, the audio module 170 may synthesize a plurality of digital audio signals to produce at least one digital audio signal using at least one function of the audio signal processor 240, instead of separately providing the audio input mixer 220 or the audio output mixer 260.

According to an embodiment, the audio module 170 may include an audio amplifier (not shown) (e.g., a speaker amplification circuit) capable of amplifying an analog audio signal input through the audio input interface 210 or an audio signal to be output through the audio output interface 270. According to an embodiment, the audio amplifier may be configured as a module separate from the audio module 170.

Figure 3:
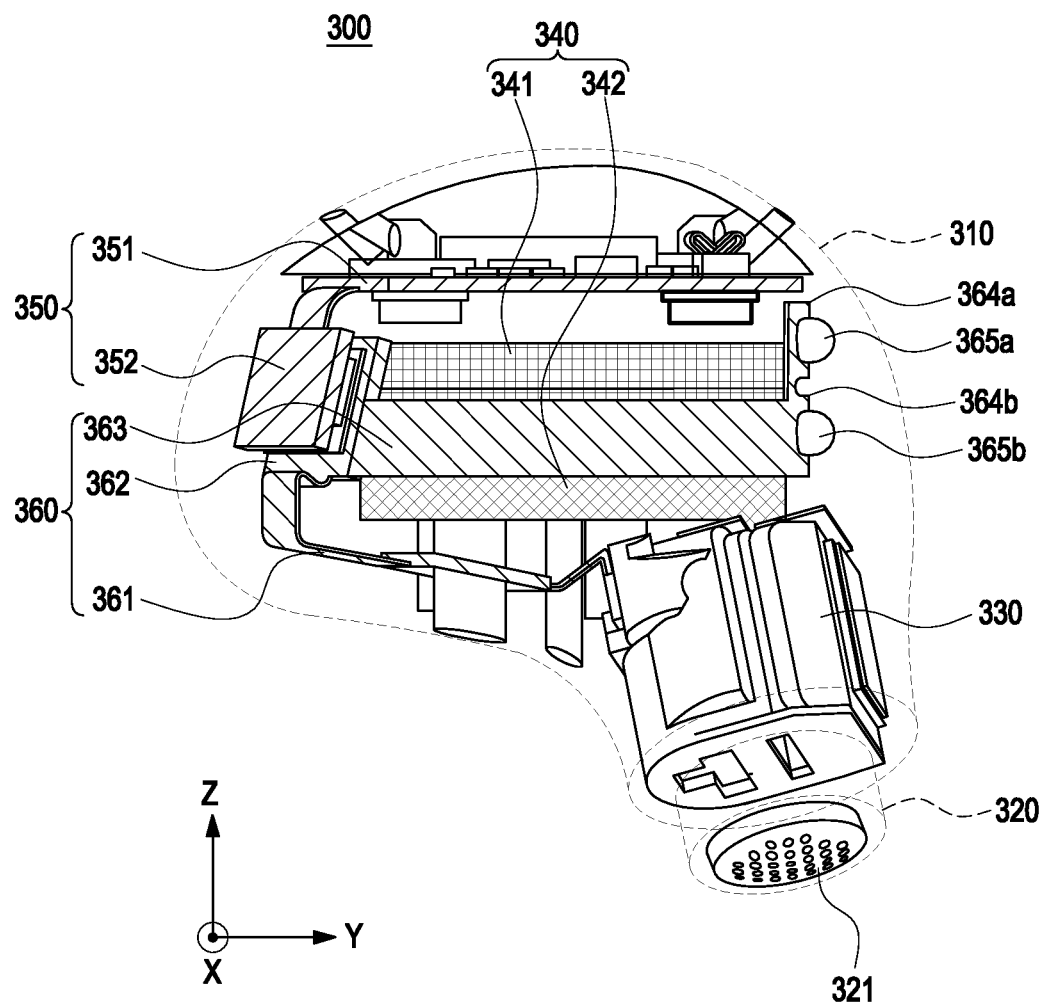
FIG. 3 is a diagram illustrating an electronic device according to an embodiment of the disclosure.

FIG. 3 is a diagram illustrating an electronic device according to an embodiment of the disclosure.

Figure 4:
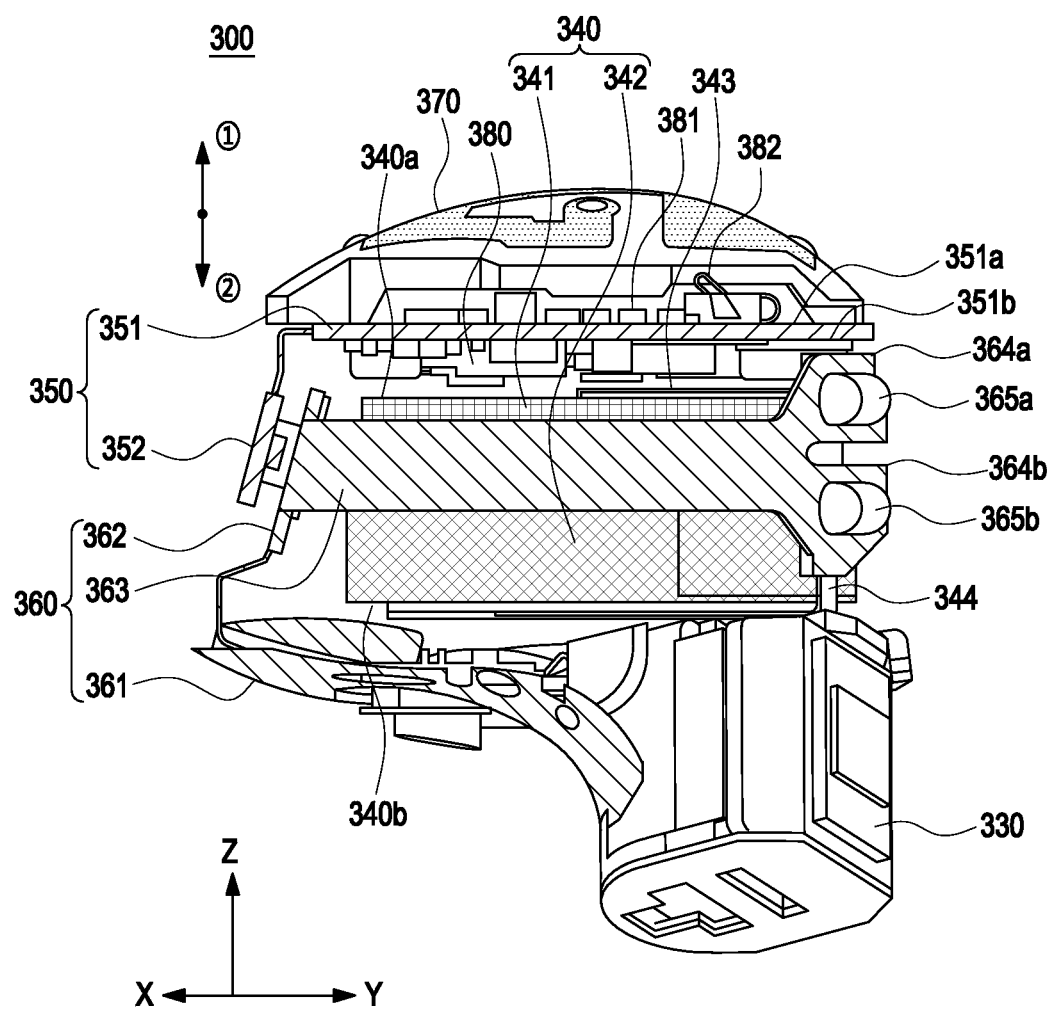
FIG. 4 is a diagram illustrating an electronic device, excluding a housing from the embodiment shown in FIG. 3 according to an embodiment of the disclosure.

FIG. 4 is a view showing an electronic device, excluding a housing from the embodiment shown in FIG. 3 according to an embodiment of the disclosure.

A description will be made based on the case where the electronic device (e.g., the electronic device 101 in FIG. 1) is a wearable electronic device 300 by way of example with reference to FIGS. 3 and 4 and subsequent drawings. Although the wearable electronic device 300 will be described as one of an embodiment of the disclosure for convenience of explanation, it should be noted that the scope of the disclosure is not necessarily limited to the type and form of the wearable electronic device 300 shown in the drawings.

The wearable electronic device 300 according to an embodiment of the disclosure may correspond to a device that is able to be worn on a part of the body, for example, on the ear or on the head. An example of the wearable electronic device 300 may include wireless earphones (or an in-ear earset) or a hearing aid, and may further include various product groups in which a speaker or a microphone is disposed.

In various drawings of the disclosure, as an example of the wearable electronic device 300, the kernel-type in-ear earset mounted in the ear canal from the pinna to the eardrum may be described by way of example. However, it should be noted that the disclosure is not limited thereto. According to another embodiment, although not shown in the drawing, the wearable electronic device 300 may be an open-type earset mounted to the pinna.

FIG. 3 shows a direction component X, a direction component Y, and a direction component Z. The direction component X, the direction component Y, and the direction component Z may be orthogonal to each other and form a spatial coordinate system defined by the X-axis, the Y-axis, and the Z-axis. For example, the direction component X may indicate the horizontal width direction of the wearable electronic device 300, the direction component Y may indicate the vertical width direction of the wearable electronic device 300, and the direction component Z may indicate the height direction of the wearable electronic device 300. Meanwhile, according to an embodiment of the disclosure, the direction component Z may indicate a first direction in which a first surface (hereinafter, first surface 340a in FIG. 4 and first surface 400a in FIG. 6A) of a battery is directed and/or a second direction in which a second surface (hereinafter, second surface 340b in FIG. 4 and second surface 400b in FIG. 7A) of the battery is directed. For example, as shown in FIG. 4, the direction component Z may be parallel to a first direction 1 in which the first surface of the battery is directed and may be opposite a second direction 2 in which the second surface of the battery is directed. In the following description, the first direction 1 in which the first surface of the battery is directed and the second direction 2 in which the second surface of the battery is directed are merely provided for the convenience in describing an overlapping structure between the battery and other elements included in the wearable electronic device 300 and are not intended to indicate specific directions.

Referring to FIG. 3, a housing 310 of the wearable electronic device 300 according to an embodiment of the disclosure may include a protrusion 320. The housing 310 may form a space for mounting various components therein. For example, acoustic components (e.g., a speaker and/or a microphone) and electronic components (e.g., a battery, a power management circuit, and/or a wireless communication module) may be disposed inside the housing 310. For example, the power management circuit (e.g., the power management module 188 in FIG. 1) may be a protection circuit module (PCM) or a battery management system (BMS), or may be an integrated form of the protection circuit module and the battery management system. The protrusion 320 may be a portion combined to protrude from one side of the housing 310 in one direction. An opening 321 may be formed at the end of the protrusion 320 to provide an input and/or output path of sound. The wearable electronic device 300 may be inserted and mounted to at least a part of the body (the ear canal or at least the pinna of the body) using the protrusion 320. The protrusion 320 may further have an ear tip mounted thereto, and come into close contact with at least a part of the body through the ear tip (not shown) to be more stably supported on at least a part of the body.

According to an embodiment, the wearable electronic device 300 may have an asymmetric shape. The asymmetric shape of the wearable electronic device 300 results by considering arrangement relationships between the acoustic components and the electronic components inside the housing 310 for securing acoustic performance, as well as ergonomic factors.

The wearable electronic device 300 (e.g., the electronic device 101 in FIG. 1) may be a configuration integrated into the wearable electronic device 300 and another electronic device (e.g., the external electronic device 102 in FIG. 1), or may be a configuration provided separately from an external electronic device (e.g., the external electronic device 102 in FIG. 1). The electronic device (e.g., the external electronic device 102 in FIG. 1) may be one of various types of devices. The electronic device (e.g., the external electronic device 102 in FIG. 1) may include, for example, a smartphone, a mobile phone, a navigation device, a game machine, a television (TV), a head unit for a vehicle, a notebook computer, a laptop computer, a tablet computer, a personal media player (PMP), a personal digital assistant (PDA), a portable communication device, a computer device, a portable multimedia device, a portable medical device, a camera, a wearable device, or various home appliances. The electronic device according to the embodiment of the disclosure is not limited to the devices described above.

The wearable electronic device 300 may be connected to the electronic device (e.g., the external electronic device 102 in FIG. 1) through wired or wireless communication. In this case, the wearable electronic device 300 may serve as an audio output interface (or the audio output module (e.g., the sound output module 155 in FIG. 1)), in the relationship with the electronic device (e.g., the external electronic device 102 in FIG. 1), which outputs audio signals generated in the electronic device (e.g., the external electronic device 102 in FIG. 10) to the outside. Additionally or alternatively, the wearable electronic device 300 disclosed in this document may also serve as an audio input interface (or an input module (e.g., the input module 150 in FIG. 1)) for receiving an audio signal corresponding to the sound obtained from the outside of the electronic device (e.g., the external electronic device 102 in FIG. 1).

Hereinafter, a description may be made based on the case where the wearable electronic device 300 is provided separately from the electronic device (e.g., the external electronic device 102 in FIG. 1) by way of example. Accordingly, the electronic device (e.g., the external electronic device 102 in FIG. 1) in the following embodiments may be referred to as an "external electronic device" (e.g., the external electronic device 102 in FIG. 1) because it may be provided separately from the wearable electronic device 300.

In the case in which the wearable electronic device 300 is wirelessly connected to the external electronic device (e.g., the external electronic device 102 in FIG. 1), the wearable electronic device 300 may communicate with the external electronic device through a network (e.g., a short-range wireless communication network or a long-range wireless communication network). The network may include, but is not limited to, a mobile or cellular network, a local area network (LAN) (e.g., Bluetooth™ communication), a wireless local area network (WLAN), a wide area network (WAN), the Internet, a small area network (SAN), or the like.

The wearable electronic device 300 may include a communication module (e.g., the communication module 190 in FIG. 1). In addition, according to an embodiment, the wearable electronic device 300 may further include at least one of a power management module (e.g., the power management module 188 in FIG. 1), a sensor module (e.g., the sensor module 176 in FIG. 1), a battery (e.g., the battery 189 in FIG. 1), an antenna module (e.g., the antenna module 197 in FIG. 1). The communication module may be a wireless communication module in an embodiment in which the wearable electronic device 300 is wirelessly connected to the external electronic device. In addition, the wearable electronic device 300 according to an embodiment may further include other elements in addition to the elements according to various embodiments described above. For example, the wearable electronic device 300 may further include an audio module (e.g., the audio module 170 in FIG. 1). The audio module (e.g., the audio module 170 in FIG. 1) may include, for example, an audio input mixer (e.g., the audio input mixer 220 in FIG. 2), an analog-to-digital converter (ADC) (e.g., the ADC 230 in FIG. 2), an audio signal processor (e.g., the audio signal processor 240 in FIG. 2), a DAC digital-to-analog converter (DAC) (e.g., the DAC 250 in FIG. 2), or an audio output mixer (e.g., the audio output mixer 260 in FIG. 2). Descriptions of the respective elements of the audio module included in the wearable electronic device 300, which have been made in the embodiment described with reference to FIG. 2, will be omitted. The respective elements of the audio module may be integrated into a compact structure inside the housing 310 of the wearable electronic device 300.

According to an embodiment, the wearable electronic device 300 may not communicate with an external electronic device (e.g., the external electronic device 102 in FIG. 1). In this case, the wearable electronic device 300 may be configured to receive a signal corresponding to the sound obtained from the outside according to the operation (or the control) of the components included in the wearable electronic device 300 and output an audio signal to the outside, instead of being controlled through the external electronic device (e.g., the external electronic device 102 in FIG. 1). For example, the wearable electronic device 300 may be a stand-alone type electronic device that plays music or videos by itself without communicating with the external electronic device, thereby outputting the sound according thereto, or receives and processes a user voice.

According to another embodiment, the wearable electronic device 300 may communicate with an external electronic device (e.g., the external electronic device 102 in FIG. 1) and/or may be controlled by the same. The wearable electronic device 300 may be an interaction type electronic device that is paired with an external electronic device (e.g., the external electronic device 102 in FIG. 1) such as a smartphone through a communication method such as Bluetooth™ and the like and converts data received from the external electronic device (e.g., the external electronic device 102 in FIG. 1) to output the sound, or receives a user voice and transmits the same to the external electronic device.

Respective elements included in the wearable electronic device 300 according to an embodiment of the disclosure will be described with reference to FIGS. 3 and 4.

The wearable electronic device 300 may include a battery 340 that is disposed in the inner space of the housing 310 and includes the first surface 340*a* directed in a first direction, the second surface 340*b* directed in a second direction different from the first direction, and a third surface 340*c* directed in a third direction different from the first direction and the second direction.

According to an embodiment, the battery 340 may be configured as a coin-shaped coin-cell battery. The battery 340 may be configured by winding or superimposing a stack of an anode plate, a cathode plate, and a separator, which are formed in a thin plate or film. For example, the battery 340 may be configured as a jelly-roll type electrode assembly formed by rolling a stack of an anode plate, a cathode plate, and a separator. As another example, the battery 340 may be configured as a stacked type electrode assembly formed by superimposing stacks of an anode plate, a cathode plate, and a separator laminate. A peripheral member (e.g., peripheral member 430 in FIG. 6A and subsequent drawings) (e.g., CAN) may be formed on the outer surface of a battery 400 to surround at least a portion of a battery cell, thereby protecting the battery cell and/or seating the battery cells.

In the battery 340, a first electrode tap 343 may be formed on the first surface 340*a*, and a second electrode tap 344 may be formed on the second surface 340*b*. In an embodiment, the battery 340 may have a tap and a lead of the anode formed on one side of the battery cell, and the direction in which the tap and lead of the anode (hereinafter, referred to as an "anode" for short) are formed may be directed in a direction opposite the direction in which a tap and a lead of the cathode (hereinafter, referred to as a "cathode" for short), which are formed on the opposite side of the battery cell, are directed. For example, a bidirectional electrode terminal may be applied to the battery 340. According to various embodiments, a positive terminal may be formed on one surface (e.g., the first surface 340*a*) of the battery 340, and a negative terminal may be formed on the opposite surface (e.g., the second surface 340*b*) of the battery 340 directed in the opposite direction of the one surface. Alternatively, a negative terminal may be formed on one surface (e.g., the first surface 340*a*) of the battery 340, and a positive terminal may be formed on the opposite surface (e.g., the second surface 340*b*) of the battery 340 directed in the opposite direction of the one surface.

Since the battery 340 is small in size, there may be difficulty in providing the protection circuit module (PCM) inside the battery cell or to the outer position adjacent to the battery. Accordingly, the wearable electronic device 300 according to an embodiment of the disclosure may include, as a configuration for disposing the PCM adjacent to the battery 340, a printed circuit board in which the protection circuit module is disposed. The protection circuit module may execute an overcharge protection voltage function, an over discharge protection voltage function, an overcurrent protection/detection current function, and/or a short protection/detection condition function. In addition, additionally or alternatively to the various functions, the protection circuit module may monitor information on the battery (e.g., charge/discharge status, voltage, temperature, pressure, etc.) and operate as a battery management system (BMS) including a function of transmitting or controlling battery information using wired and wireless communication and a function of managing the remaining power of the battery, an available period of time, a charge/discharge history, or the like. Accordingly, the protection circuit module may be referred to as a "power management circuit" in describing the following embodiments.

The wearable electronic device 300 may include at least one printed circuit board. For example, at least one printed circuit board may include a first board part disposed to be spaced a predetermined distance apart from the first surface 340*a* of the battery 340 and including a power management circuit 381 for providing power used for the operation of the wearable electronic device 300 to at least one electronic component 380 disposed inside the wearable electronic device 300 using the power of the battery 340. As another example, at least one printed circuit board may include a second board part electrically connected to the battery 340 and disposed to surround at least a portion of the second surface 340*b* and/or the third surface 340*c* of the battery 340.

Referring to FIGS. 3 and 4, the first board part and the second board part of the printed circuit board may correspond to reference numerals 350 and 360, respectively. According to an embodiment, although the printed circuit board may be configured such that the first board part and the second board part are integrally connected, the first board part and the second board part may be substantially (or physically/electrically) separated as shown in FIGS. 3 and 4 and may be configured to be connectable to each other through at least one connector. Although a description will be made below based on the configuration in which the first board part and the second board part of the printed circuit board are substantially (or physically/electrically) separated, the scope of an embodiment of the disclosure is not intended to exclude the configuration in which the first board part and the second board part are integrally connected. Meanwhile, in the configuration in which the first board part and the second board part of the printed circuit board are substantially (or physically/electrically) separated, the first board part of the printed circuit board may be referred to as a "first printed circuit board 350," and the second board part of the printed circuit board may be referred to as a "second printed circuit board 360."

According to an embodiment, at least a portion of the first printed circuit board 350 and/or the second printed circuit board 360 may be configured as a flexible printed circuit board (FPCB). Since at least a portion of the first printed circuit board 350 and/or the second printed circuit board 360 is configured as a flexible printed circuit board, it is possible to easily secure conductive paths between a plurality of elements in a narrow space of the housing 310. According to an embodiment, the first printed circuit board 350 may include a first plate part 351 on which the at least one electronic component 380 is disposed and a first connection part 352, and the second printed circuit board 360 may include a first extension part 361 for an electrical connection with other electronic components that are not disposed on the first printed circuit board 350, a second connection part 362, and a second extension part 363 for an electrical connection with the battery 400. According to an embodiment, the first printed circuit board 350 and the second printed circuit board 360 may be physically/electrically connected to each other on the third surface 340c of the battery 340. For example, the first connection part 352 (e.g., a connector) of the first printed circuit board 350 and the second connection part 362 (e.g., a connector) of the second printed circuit board 360 may be connected to each other on a third surface 400c of the battery 400.

According to an embodiment, a plurality of electronic components (e.g., the at least one electronic component 380) may be disposed on the first printed circuit board 350, and the plurality of electronic components disposed on the first printed circuit board 350 may include, for example, the power management circuit 381 (e.g., the power management module 188 of FIG. 1) of the battery 340. According to another embodiment, the first printed circuit board 350 may include at least one electronic component on each of a surface 351b facing the first surface 340a of the battery 340 and a surface 351a directed in the same direction as the first direction 1 in which the first surface 340a is directed. According to an embodiment, as shown in FIGS. 3 and 4, the first printed circuit board 350 may be disposed to overlap the battery 400 in the first direction 1. For example, the first printed circuit board 350 may be disposed to be spaced a predetermined distance apart from the first surface 400a of the battery 400 in the first direction 1.

The wearable electronic device 300 may include at least one support member 311 disposed inside the housing 310. For example, the wearable electronic device 300 may include a support member 311 disposed between the first printed circuit board 350 and the housing 310 to support the first printed circuit board 350 and/or various electronic components. According to another example, although not shown in the drawing, the wearable electronic device 300 may further include a bracket to support a spacer or elements occupying a space between the battery 340 and the first printed circuit board 350.

According to an embodiment, the second printed circuit board 360 may be a configuration provided to transmit power of the battery 340 to the first printed circuit board 350 and/or to supply power to electronic components that are not disposed on the first printed circuit board 350, such as a speaker 330. According to an embodiment, the second printed circuit board 360 may be formed to surround at least a portion of the second surface 340b and/or the third surface 340c of the battery 340. For example, the first printed circuit board 350 may be formed to surround at least a portion of the first surface 340a of the battery 340, and the second printed circuit board 360 may be formed to surround at least a portion of the second surface 340b of the battery 340. As another example, the first printed circuit board 350 may be formed to surround at least a portion of the first surface 340a of the battery 340, and the second printed circuit board 360 may be formed to surround at least a portion of the third surface 340c of the battery 340. As another example, as shown in FIGS. 3 and 4, the first printed circuit board 350 may be formed to surround at least a portion of the first surface 340a of the battery 340, and the second printed circuit board 360 may be formed to surround at least a portion of the second surface 340b and the third surface 340c of the battery 340.

According to an embodiment, in the case where the first printed circuit board 350 surrounds at least a portion of the first surface 340a of the battery 340 and where the second printed circuit board 360 surrounds at least a portion of the second surface 340b of the battery 340, the first printed circuit board 350 may be electrically connected to a first electrode 341 of the first surface 340a, and the second printed circuit board 360 may be electrically connected to a second electrode 342 of the second surface 340b. According to some embodiments, connection members (not shown) (e.g., C-clips, conductive wires, and/or pogo pins) may be disposed on one side of the first printed circuit board 350 and one side of the second printed circuit board 360 so as to come into electrical contact with the first surface 340a and the second surface 340b of the battery 340, respectively. As described above, if a pair of connection members (not shown) (e.g., C-clips, conductive wires, and/or pogo pins) is provided to connect the first electrode 341 and the second electrode 342 to the first printed circuit board 350 and the second printed circuit board 360, respectively, in the battery 340 in which the first electrode 341 and the second electrode 342 are formed in opposite directions, instead of in the same direction, the size of the electronic device may increase in the height direction, thereby restricting the miniaturization/compact design of a product.

According to an embodiment of the disclosure, it is possible to reduce the constraints on the miniaturization/compact design of a product by implementing electrical connections of the first electrode 341 and the second electrode 342 of the battery 340 with the printed circuit board on the side surface (e.g., the third surface 340c) of the battery 340. The structure in which the first electrode 341 and the second electrode 342 of the battery 340 are connected to the second printed circuit board 360 on the side surface (e.g., the third surface 340c) of the battery 340 may reduce the size of the wearable electronic device 300 in the height direction (the Z-axis direction). Referring to FIGS. 3 and 4, the second printed circuit board 360 may include a first contact portion 364a to be connected to the first electrode 341 of the battery 340 and a second contact portion 364b to be connected to the second electrode 342 thereof at the end of the second extension part 363. In an embodiment, the second printed circuit board 360 may be connected to the first electrode 341 of the battery 340 in the first contact portion 364a by soldering, and may be connected to the second electrode 342 of the battery 340 in the second contact portion 364b by soldering. For example, a first soldering part 365a may be formed in the first contact portion 364a of the second printed circuit board 360 by a soldering operation between the first electrode tap 343 of the battery 340 and the first contact portion 364a, and a second soldering part 365b may be formed in the second contact portion 364b of the second printed circuit board 360 by a soldering operation between the second electrode tap 344 of the battery 340 and the second contact portion 364b.

Referring to FIG. 4, according to an embodiment of the disclosure, on the premise that the wearable electronic device 300 communicates with and/or is controlled by an external electronic device (e.g., the external electronic device 102 of FIG. 1), an embodiment including an antenna 370 may be described. According to an embodiment of the disclosure, various wireless communication methods including Bluetooth™ may be implemented using the antenna 370 included in the wearable electronic device 300. According to an embodiment, a laser direct structuring (LDS) antenna disposed on one side of the housing 310 or disposed adjacent to the housing 310 may be applied to the antenna 370. For example, an LDS antenna including an antenna pattern having copper or nickel plate formed using laser on the surface of the support member 311 formed of a thermoplastic resin may be applied to the antenna 370.

According to an embodiment, the antenna 370 may be disposed on the surface of the wearable electronic device 300, for example, on one side of the housing 310 or adjacent to the housing 310, for ease of radiation so as to be spaced apart from the first printed circuit board 350 on which a processor (e.g., a communication processor) for controlling the antenna 370 and various electronic components including a communication module are disposed. According to an embodiment, the antenna 370 may be disposed in a first direction of the first printed circuit board 350. For example, the antenna 370 may be disposed to be spaced a predetermined distance apart from the surface of the first printed circuit board 350, which is directed in the first direction ①. The wearable electronic device 300 may include a connection member 382 to connect the antenna 370 and the first printed circuit board 350, which are spaced apart from each other. For example, the connection member 382 may be the C-clip shown in FIG. 4, but is not necessarily limited thereto, and may be various types of members for electrically connecting an element to another element, such as a conductive wire or a pogo pin.

Figure 5:
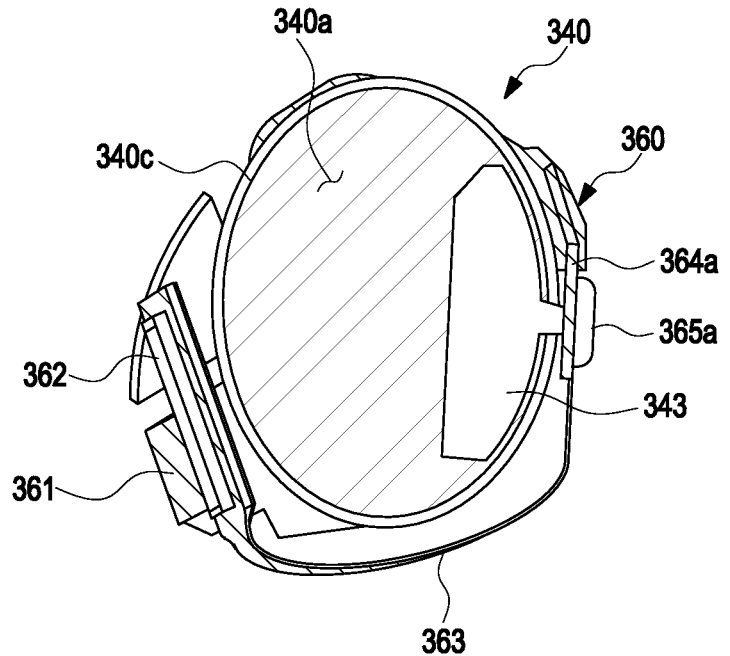
FIG. 5 is a diagram illustrating an arrangement relationship between a battery and a second printed circuit board according to an embodiment of the disclosure.
Figure 5:
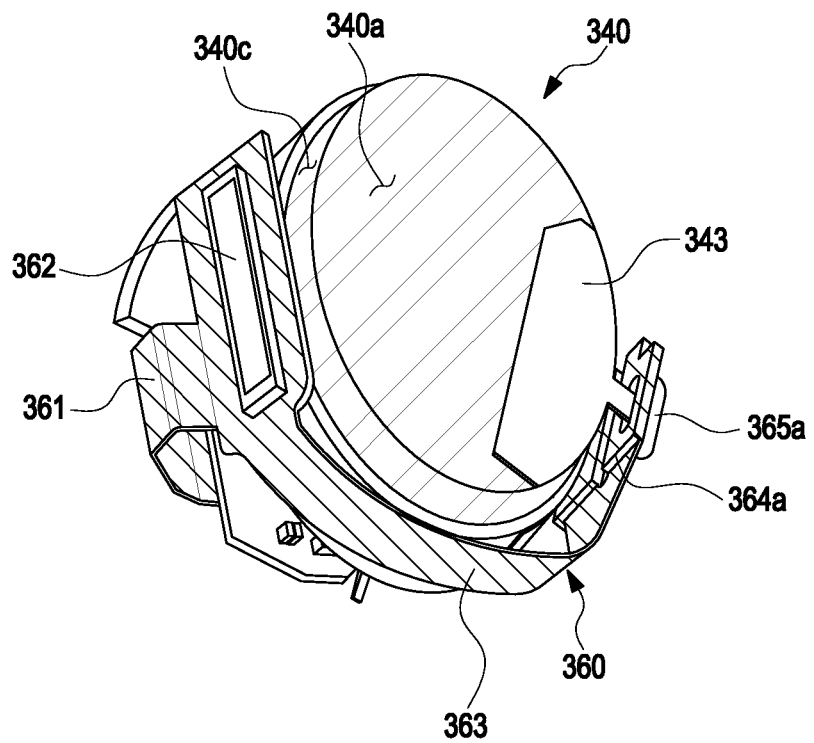

FIG. 5 is a diagram illustrating an arrangement relationship between a battery and a second printed circuit board according to an embodiment of the disclosure.

Figure 6A:
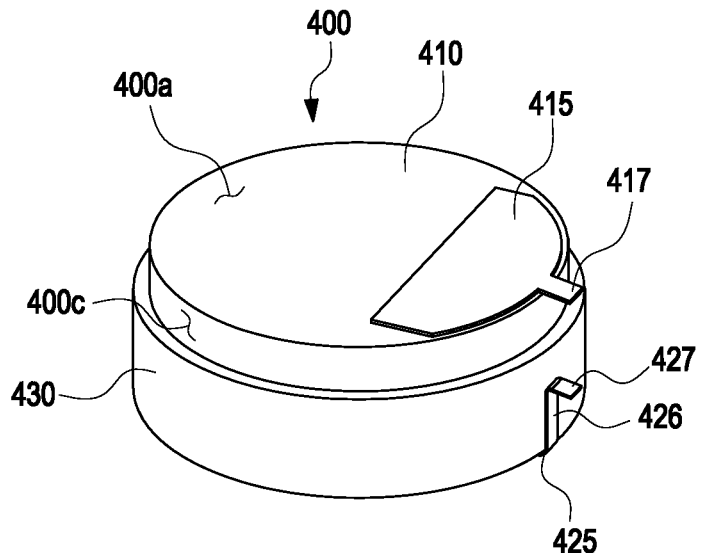
FIG. 6A is a perspective view illustrating a battery according to an embodiment of the disclosure.
Figure 6B:
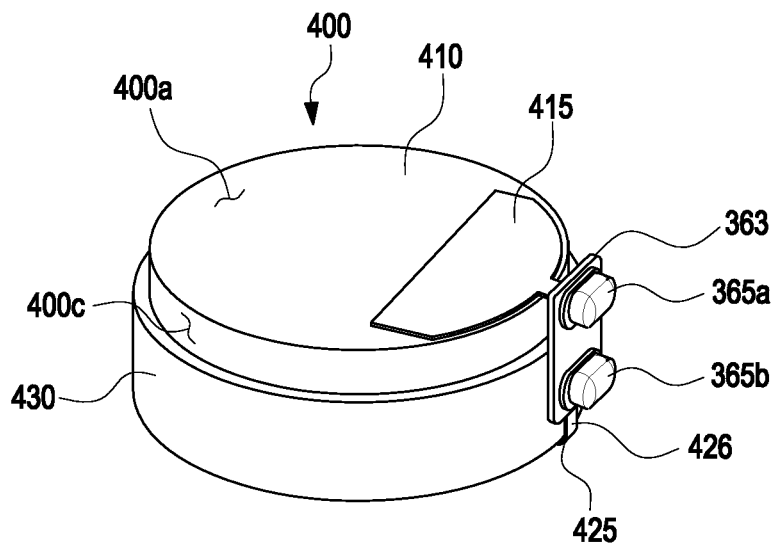
FIG. 6B is a perspective view illustrating a state in which a second printed circuit board is connected to a battery according to an embodiment of the disclosure.

FIG. 6A is a perspective view illustrating a battery according to an embodiment of the disclosure. FIG. 6B is a perspective view illustrating a state in which a second printed circuit board is connected to a battery according to an embodiment of the disclosure.

Referring to FIGS. 4, 5, 6A, and 6B, a second printed circuit board 360 surrounding at least a portion of a second surface 340b (hereinafter, "the second surface 400b") and a third surface 340c (hereinafter, "the third surface 400c") of the battery 340 (hereinafter, "the battery 400") is disclosed. FIG. 6B briefly shows only the end of the second extension part 363 of the second printed circuit board 360 for convenience.

According to an embodiment, the battery 400 may have the first electrode tap 343 (hereinafter, "the first electrode tap 415") formed on the first surface 340a (hereinafter, "the first surface 400a") so as to extend at least partially parallel to the first surface 400a, and the second electrode tap 344 (hereinafter, "the second electrode tap 425") formed on second surface 400b so as to extend at least partially parallel to the second surface 400b. According to an embodiment, the first electrode tap 415 and/or the second electrode tap 425 may be formed to include a plate portion at least partially parallel to the first surface 400a or the second surface 400b, and/or a thin and extended portion bent from the plate portion toward the third surface 400c of the battery 400. For example, the battery 400 may include the first electrode tap 415 including a plate portion parallel to the first surface 400a as shown in FIG. 5, and the second electrode tap 425 including a plate portion parallel to the second surface 400b and a thin and extended portion corresponding to the third surface 400c as shown in FIG. 4. Here, the plate portion may be formed to have an arc shape in at least part to correspond to the shape of the first surface 400a or the second surface 400b of the coin-cell battery (e.g., the battery 400). In addition, the bent portion of the second electrode tap 425 may extend at least partially parallel to the third surface 400c. According to an embodiment, the portion parallel to the second surface 400b of the second electrode tap 425 may be referred to as a "first portion" of the second electrode tap 425, and the portion parallel to the third surface 400c may be referred to as a "second portion 426." FIGS. 4, 5, 6A, and 6B show that the first electrode tap 415 includes only a flat plate portion and that the second electrode tap 425 includes a flat plate portion and a thin and extended portion. However, unlike this, the first electrode tap 415 may further include a thin and extended portion, as well as the flat plate portion. In the following drawings, although a description will be made based on the embodiment in which only one tap (e.g., the second electrode tap 425) includes both the flat plate portion and the thin and extended portion for convenience, it should be noted that the disclosure is not limited thereto.

According to an embodiment, a portion of the first electrode tap 415 may be disposed in close contact with the first surface 400a of the coin-cell battery (e.g., the battery 400), and another portion thereof may protrude outwards from the first surface 400a to the outside. According to an embodiment, the first electrode tap 415 may include a first end 417 directed in the third direction. A portion of the second electrode tap 425 may also be disposed in close contact with the second surface 400b of the coin-cell battery (e.g., the battery 400), and another portion thereof may protrude outwards from the second surface 400b. However, the second electrode tap 425 may be bent and extend long on the third surface 400c. According to an embodiment, the second electrode tap 425 may include a second end 427 protruding outwards in the third direction from the third surface 400c.

Referring to FIGS. 5, 6A, and 6B, a first contact portion 364a having an opening (e.g., a first opening 366a) in which a first electrode tap 415 is received, a second contact portion 364b having an opening (not shown) in which a second electrode tap 425 is received, a first soldering part 365a, and a second soldering part 365b may be formed in the second extension part 363 of the second printed circuit board 360.

Hereinafter, a configuration for improving stability of a soldering joint structure and operation, and the ease of managing the amount of solder to be used, according to an embodiment of the disclosure, in performing an operation of soldering the first electrode tap 415 and the second electrode tap 425 to form the first soldering part 365a and the second soldering part 365b will be described.

Figure 7A:
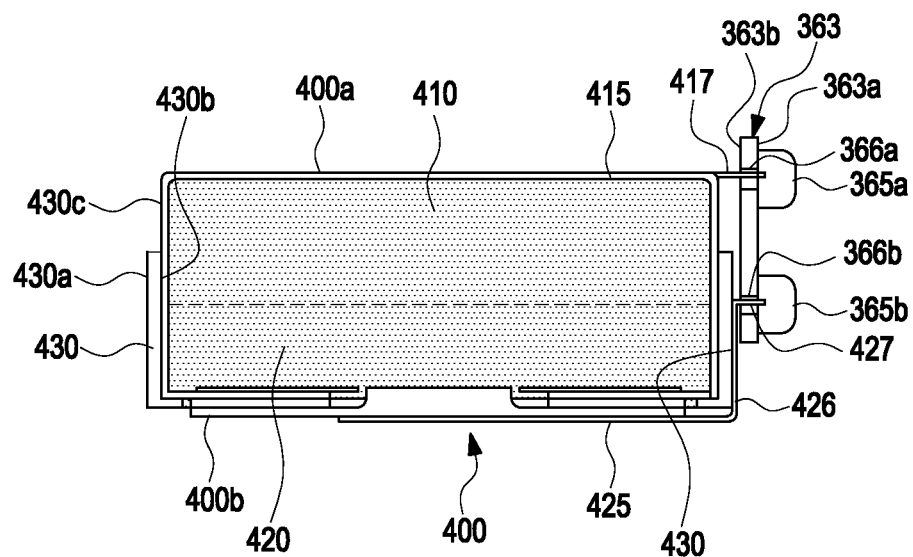
FIG. 7A is a cross-sectional view illustrating a state in which a printed circuit board is connected to a battery according to an embodiment of the disclosure.

FIG. 7A is a cross-sectional view illustrating a state in which a printed circuit board (e.g., the second printed circuit board 360) is connected to a battery according to an embodiment of the disclosure.

Figure 7B:
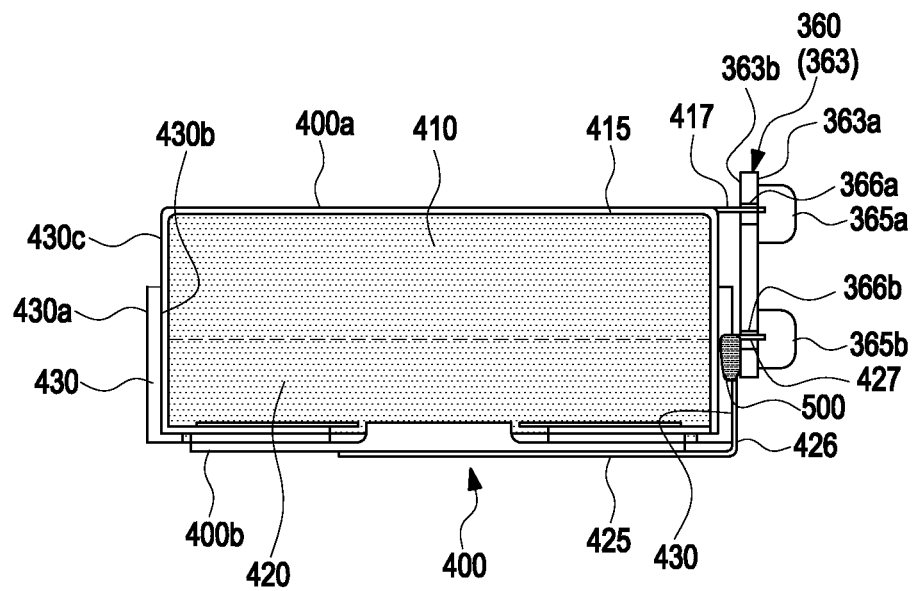
FIG. 7B is a cross-sectional view illustrating a state in which solder excessively flows to the rear surface of a printed circuit board in a state in which the printed circuit board is connected to a battery according to an embodiment of the disclosure.

FIG. 7B is a cross-sectional view illustrating a state in which solder excessively flows into a rear surface of a printed circuit board (e.g., the second printed circuit board 360) in the state in which the second printed circuit board is connected to a battery according to an embodiment of the disclosure (comparative embodiment).

Referring to FIG. 7A, a battery 400 of the disclosure may include a peripheral member 430 for surrounding at least a portion of a battery cell to protect the battery and to allow the battery cell to be seated. According to another embodiment, the peripheral member 430 may be formed of, for example, a polycarbonate (PC) material. The peripheral member may serve as a support member for supporting the battery 400 and/or the second printed circuit board 360.

According to an embodiment, the peripheral member 430 may be formed to surround only a portion of the outer surface of the battery 400, rather than the entire portion thereof. For example, the peripheral member 430 may be formed to surround only a portion of the third surface 400c corresponding to the second portion 426 of the second electrode tap 425, among the outer surfaces of the battery 400. According to an embodiment, since the peripheral member 430 is provided, it is possible to prevent the battery 400 from being damaged by solder 500 coming into contact with the battery 400 as will be described later. The peripheral member 430 may include an outer surface 430*a* directed in the same direction as the third surface 400*c* of the battery 400, and an inner surface 430*b* facing a third surface 430*c* and directed in the opposite direction of the outer surface 430*a*. The inner surface 430*b* of the peripheral member 430 may be formed in close contact with the third surface 400*c* of the battery 400.

The battery 400 according to the embodiment shown in FIG. 7A may supply power of the battery 400 to various electronic components contained in the electronic device through the first electrode tap 415 and the second electrode tap 425 to be connected to the second printed circuit board 360. The second printed circuit board 360 may be positioned on the third surface 400*c* of the battery 400 in order to reduce restrictions on the miniaturization/compact design of a product and include openings (e.g., the first opening 366*a* and a second opening 366*b*) for receiving the ends 417 and 427 of the first electrode tap 415 and the second electrode tap 425. In addition, soldering parts (e.g., 365*a* and 365*b*) may be formed on a first surface 363*a* of the second printed circuit board 360 in order to electrically connect the second printed circuit board 360 with the first electrode tap 415 and/or the second electrode tap 425 and firmly fix the same. The first surface 363*a* of the second printed circuit board 360 may be parallel to a third direction, which is different from the first and second directions shown in FIG. 4, and may be a surface (e.g., a front surface) facing the outside of the wearable electronic device 300. Referring to FIGS. 7A and 7B, according to an embodiment, the soldering parts 365*a* and 365*b* may be formed by the solder 500 that is injected in the direction facing the front surface (e.g., the first surface 363*a*) of the second printed circuit board 360 and flows to the opposite surface (e.g., a second surface 363*b*) of the second printed circuit board 360 through the openings (e.g., the first opening 366*a* and the second opening 366*b*) formed in the second printed circuit board 360. For example, in an ideal state in which the soldering process is performed at appropriate temperature and in which an appropriate amount of solder is injected, the soldering parts 365*a* and 365*b* may be formed in the form of water droplets on one surface (e.g., the first surface 363*a*) of the second printed circuit board 360 and fill the openings (e.g., the first opening 366*a* and the second opening 366*b*) of the second printed circuit board 360 while the first end 417 of the first electrode tap 415 and the second end 427 of the second electrode tap 425 are received therein. On the other hand, according to an embodiment (comparative embodiments), solder 500 may flow to the opposite surface (e.g., the second surface 363*b*) of the second printed circuit board 360 to increase the temperature of the battery cell or melt the components (e.g., the peripheral member 430) around the battery. In addition to the above problem, it may be difficult to manage the injected amount of solder, and it may be difficult to form a soldering part of a specific size at a predetermined position. For example, the solder injected through the first opening 366*a* corresponding to the first electrode tap 415 may be solidified after a predetermined time elapses to form the first soldering part 365*a*, but the solder 500 injected through the second opening 366*b* corresponding to the second electrode tap 425 may flow down to the second surface 363*b* of the second printed circuit board 360 or the surface of the peripheral member 430 in a narrow space between the peripheral member 430 and the second printed circuit board 360. A predetermined space is provided between a first electrode 410 and the second surface 363*b* of the second printed circuit board 360, whereas the peripheral member 430 is disposed between a second electrode 420 and the second surface 363*b* of the second printed circuit board 360, so even if the same amount of solder 500 is injected, formation of the first soldering part 365*a* and the second soldering part 365*b* may be different from each other.

Hereinafter, ways to control the flow of solder between a board (e.g., the second printed circuit board 360) and an electrode tap (e.g., the second electrode tap 425) in the soldering process for electrical connections between electrodes of the battery 400 and the printed circuit board will be described.

Figure 8A:
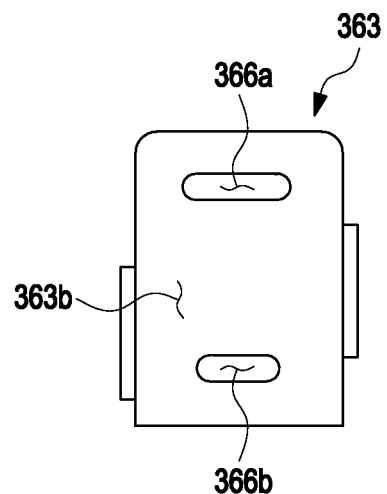
FIG. 8A is a diagram illustrating a rear surface of a printed circuit board, according to an embodiment of the disclosure.

FIG. 8A is a diagram illustrating a rear surface of a printed circuit board, according to an embodiment of the disclosure (comparative embodiment).

Figure 8B:
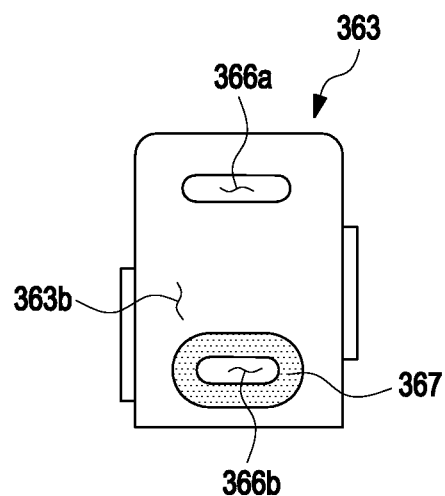
FIG. 8B is a view illustrating a rear surface of a printed circuit board on which a solder flow control member is formed according to an embodiment of the disclosure.

FIG. 8B is a view illustrating a rear surface of a printed circuit board on which a solder flow control member is formed according to an embodiment of the disclosure.

Referring to FIGS. 7A, 7B, 8A, and 8B, soldering parts 365*a* and 365*b* for connections with a first end 417 of a first electrode tap 415 and a second end 427 of a second electrode tap 425, respectively, may be formed on one surface (e.g., the first surface 363*a*) parallel to a third direction of the second printed circuit board 360, and a solder flow control member 367 may be formed on the opposite surface directed in a direction opposite the third direction of the printed circuit board (e.g., the second printed circuit board 360).

According to an embodiment, the solder flow control member 367 may be formed to surround the second opening 366*b*. In addition, the solder flow control member 367 may be formed of a material having higher thermal conductivity than the second electrode tap 425. According to another embodiment, the solder flow control member 367 may be a region formed by a conductive material (e.g., copper foil) exposed (opened) to the outside in an extension part (e.g., the second extension part 363) of the printed circuit board (e.g., the second printed circuit board 360) and may have higher thermal conductivity than the region where the conductive material (e.g., copper foil) is not exposed (opened). For example, in the case where the second electrode tap 425 is formed of a steel use stainless (SUS) stainless steel material, the solder flow control member 367 may be formed of copper (Cu) (e.g., copper foil) having higher thermal conductivity than SUS. Solder tends to flow toward a region having higher thermal conductivity. Accordingly, if the solder flow control member 367 is formed of a material having higher thermal conductivity than the second electrode tap 425, solder may flow to the solder flow control member 367. In addition, solder positioned on the solder flow control member 367 made of a copper foil may remain on the solder flow control member 367 having high thermal conductivity without flowing to the surrounding portion where the copper foil is not formed. Accordingly, it is possible to prevent the solder from flowing to the rear surface of the second printed circuit board 360 along the second electrode tap 425.

Figure 9A:
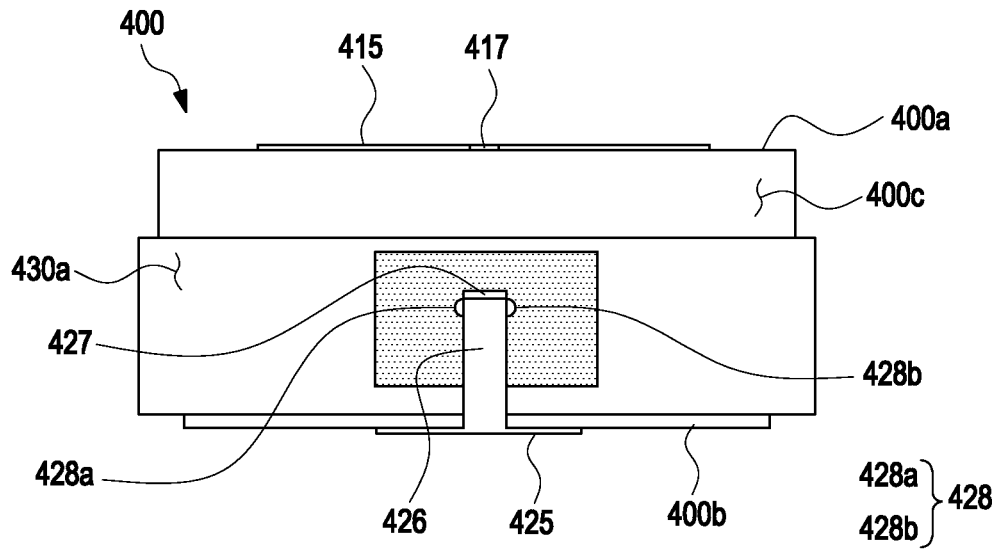
FIG. 9A is a front view of a battery in which a heat-resistant tape and a solder flow prevention protrusion are formed according to an embodiment of the disclosure.

FIG. 9A is a front view of a battery in which a heat-resistant tape and a solder flow prevention protrusion are formed according to an embodiment of the disclosure.

Figure 9B:
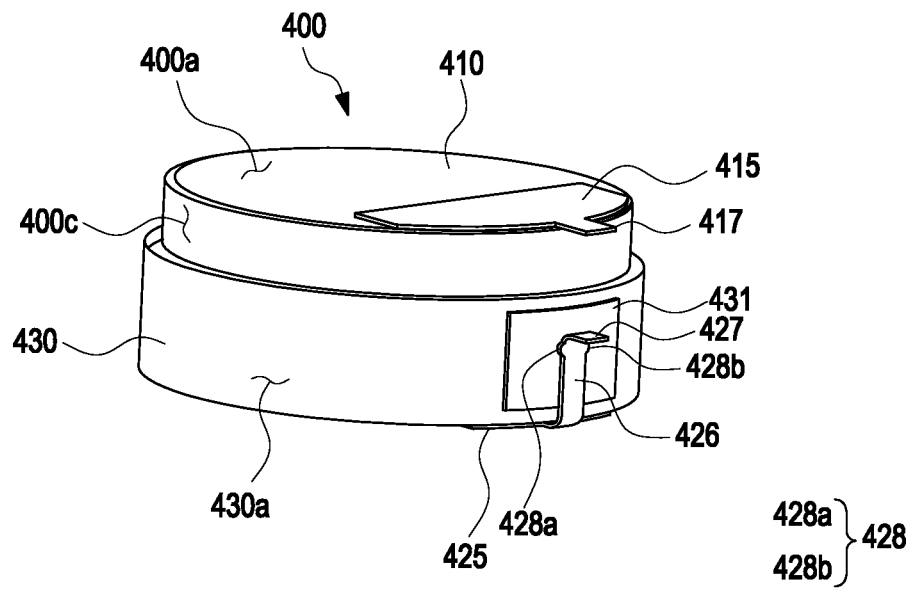
FIG. 9B is a perspective view of a battery in which a heat-resistant tape and a solder flow prevention protrusion are formed according to an embodiment of the disclosure.

FIG. 9B is a perspective view of a battery in which a heat-resistant tape and a solder flow prevention protrusion are formed according to an embodiment of the disclosure.

FIGS. 9A and 9B show an electrode tap protrusion as a ways to prevent solder from flowing to the rear surface of the second printed circuit board.

Referring to FIGS. 9A and 9B, a second electrode tap 425 may include an electrode tap protrusion 428 that partially protrude such that a second end 427 of a second portion 426 has a width greater than the width of the second portion 426. According to an embodiment, the electrode tap protrusion 428 may protrude in a direction perpendicular to the longitudinal direction of the second portion 426 of the second electrode tap 425. According to an embodiment, the electrode tap protrusion 428 may be provided as a pair of protrusions 428a and 428b. It is possible to prevent solder from passing over the second portion 426 of the second electrode tap 425 and flowing toward the battery 400 and/or the peripheral member 430 by providing the electrode tap protrusion 428. In addition, by providing the electrode tap protrusion 428, the solder may stay at the second end 427 of the second electrode tap 425 having higher thermal conductivity than the peripheral member 430, thereby preventing leakage of solder.

In addition, FIGS. 9A and 9B illustrate a heat-resistant tape 431 for preventing the peripheral member 430 from melting due to heat applied thereto or preventing heat from being transferred to the battery 400.

According to an embodiment, the heat-resistant tape 431 may be provided at a position corresponding to the second portion 426 of the second electrode tap 425 on one surface (e.g., the outer surface 430a) of the peripheral member 430. Since the heat-resistant tape 431 is positioned on the rear surface of the second portion 426 of the second electrode tap 425, it is possible to prevent heat from being transferred to the battery part even if the solder passes over the second electrode tap 425 and flows to the rear surface of the second portion 426 of the second electrode tap 425.

Figure 10:
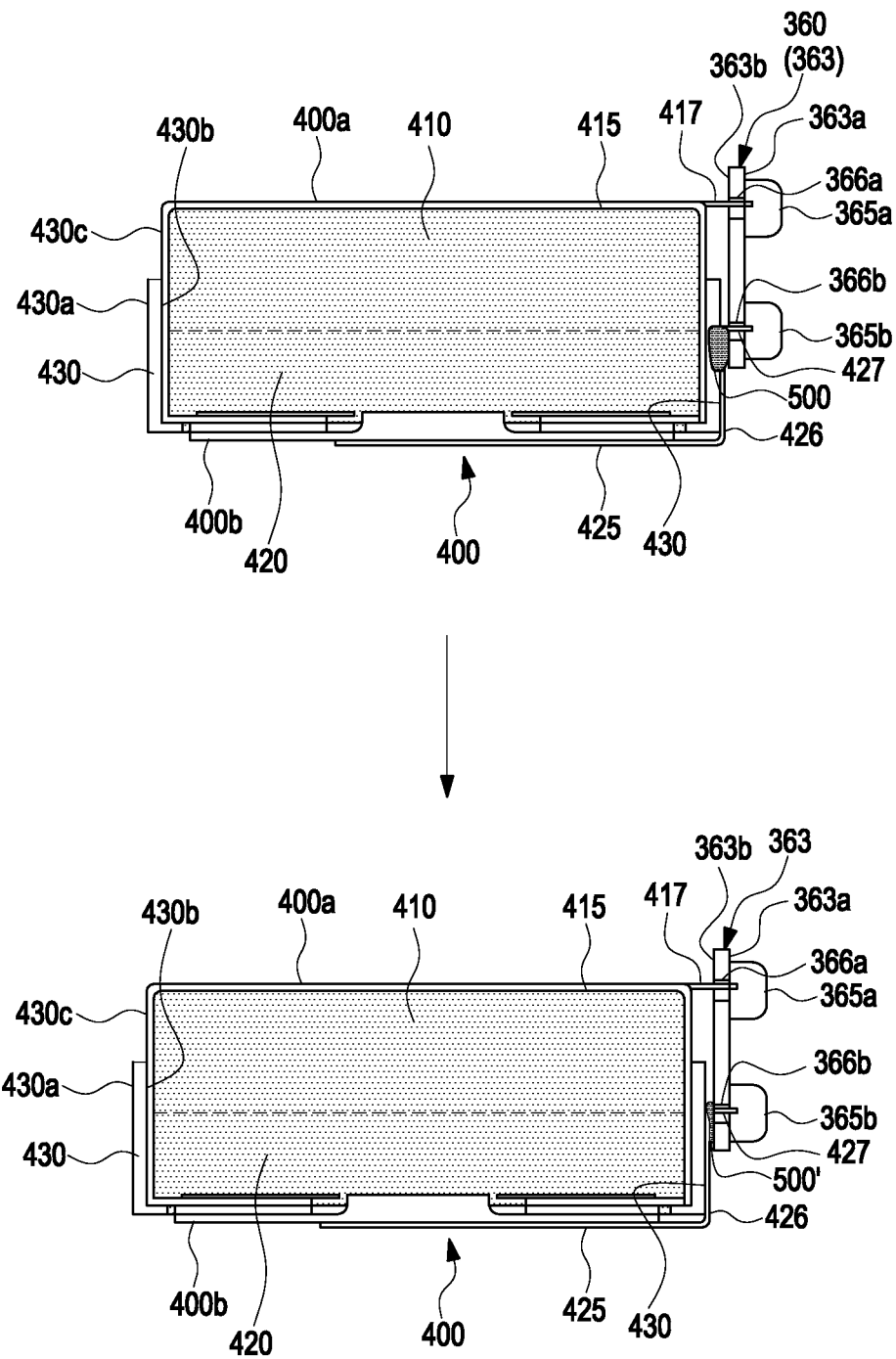
FIG. 10 is a cross-sectional view illustrating a state in which the amount of solder is controlled so that solder does not excessively flow to the rear surface of a printed circuit board in a state in which the printed circuit board is connected to a battery according to an embodiment of the disclosure.

FIG. 10 is a cross-sectional view illustrating a state in which the amount of solder is controlled so that solder does not excessively flow to the rear surface of a printed circuit board in the state in which the printed circuit board is connected to a battery according to an embodiment of the disclosure.

Referring to FIG. 10, in the embodiment (comparative embodiment) that does not provide the solder flow control member 367, the heat-resistant tape 431, and/or the electrode tap protrusion 428, solder 500 may flow to the rear surface of the second printed circuit board 360 and/or to the peripheral member 430, so it may be difficult to manage the amount of solder. However, in the embodiment providing the solder flow control member 367, the heat-resistant tape 431, and/or the electrode tap protrusion 428 in FIGS. 8A, 8B, 9A, and 9B, it can be seen that the solder 500' is restricted from flowing to the rear surface of the second printed circuit board 360 and/or to the peripheral member 430 and from passing to the battery 400 to stay around the second end 427 of the second electrode tap 425, facilitating management of the amount of solder.

According to an embodiment of the disclosure, it is possible to provide an electronic device capable of controlling the flow of solder between the board and the electrode tap in the soldering process for electrical connections between electrodes of the battery 400 and the printed circuit board (e.g., the second printed circuit board 360).

Figure 11:
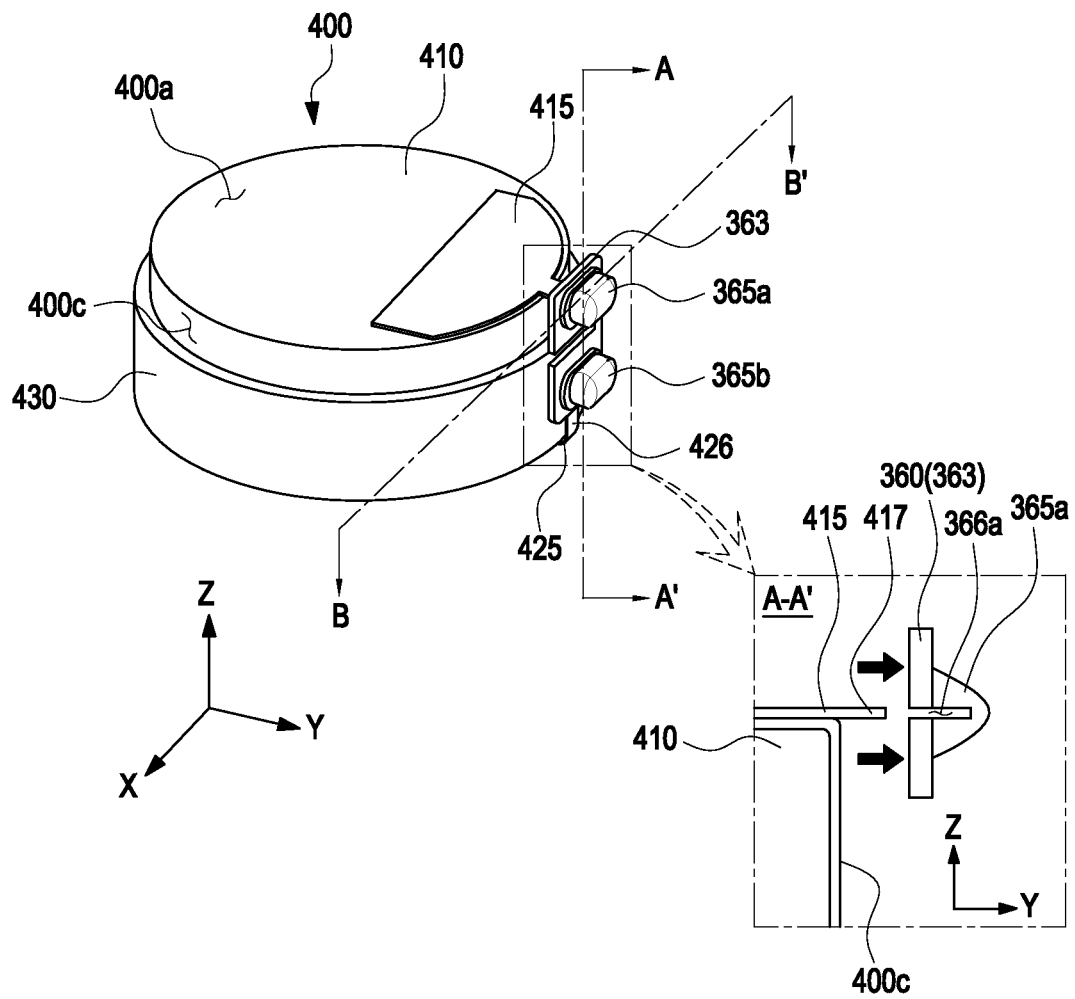
FIG. 11 is a diagram illustrating a state in which a soldering part is separated from a battery according to an embodiment of the disclosure.

FIG. 11 is a diagram illustrating the state in which a soldering part is separated from a battery according to an embodiment of the disclosure.

FIG. 11 shows an enlarged view (e.g., a cross-section taken along the imaginary line A-A') of a connection structure between an electrode tap of the battery 400 and a soldering part. Here, the electrode tap of the battery 400 may be described as the first electrode tap 415 by way of example, and the soldering part connected thereto may be described as the first soldering part 365a by way of example. In addition, a description thereof may be applied to a description of the second electrode tap 425 and the second soldering part 365b, which are not shown in the drawings, even if not mentioned separately.

Even after performing soldering between the printed circuit board (e.g., the second printed circuit board 360) and the first electrode tap 415, if an external physical impact is applied during the assembly process of an electronic device or after assembly thereof, the soldering parts may be separated from the electrode tap. Referring to FIG. 11, the first end 417 of the first electrode tap 415 may be separated from the first opening 366a of the second printed circuit board 360 where the first soldering part 365a is formed in the direction denoted by the arrows due to any physical impact, so that the battery 400 and the second printed circuit board 360 may be electrically disconnected.

Therefore, according to an embodiment of the disclosure, an electronic device capable of preventing separation between the electrode tap and the soldering parts after soldering is provided. In the disclosure, as various examples thereof, different embodiments are illustrated through FIGS. 12A to 12D. FIGS. 12A to 12D may illustrate cross-sections of an electrode tap to which a structure for preventing separation of a soldering part is applied, which is taken along the imaginary line B-B' of FIG. 11.

Figure 12A:
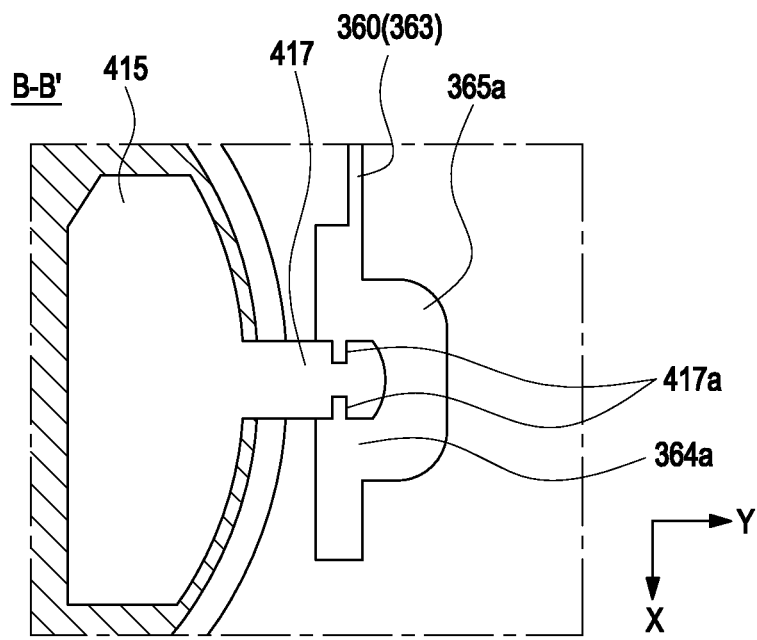
FIG. 12A is a diagram illustrating an electrode tap to which a structure for preventing separation of a soldering part is applied according to an embodiment of the disclosure.

FIG. 12A is a diagram illustrating an electrode tap to which a structure for preventing separation of a soldering part is applied according to an embodiment of the disclosure.

Figure 12B:
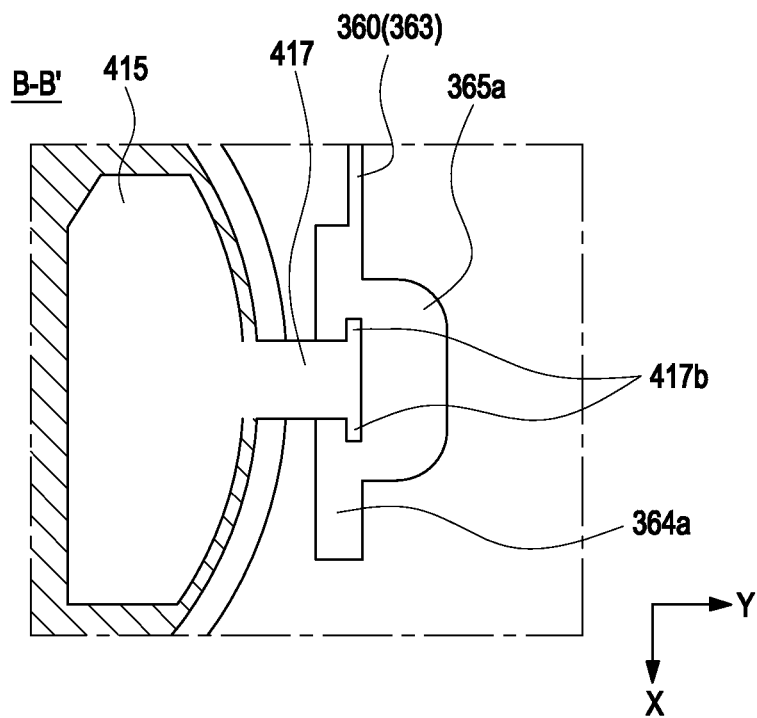
FIG. 12B is a diagram illustrating an electrode tap to which a structure for preventing separation of a soldering part is applied according to an embodiment of the disclosure.

FIG. 12B is a diagram illustrating an electrode tap to which a structure for preventing separation of a soldering part is applied according to an embodiment of the disclosure.

Figure 12C:
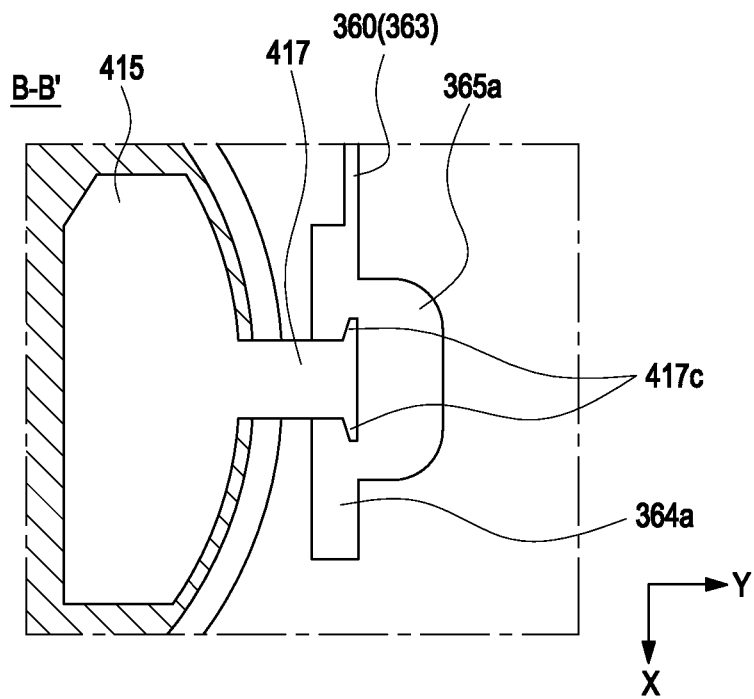
FIG. 12C is a diagram illustrating an electrode tap to which a structure for preventing separation of a soldering part is applied according to an embodiment of the disclosure.

FIG. 12C is a diagram illustrating an electrode tap to which a structure for preventing separation of a soldering part is applied according to an embodiment of the disclosure.

Figure 12D:
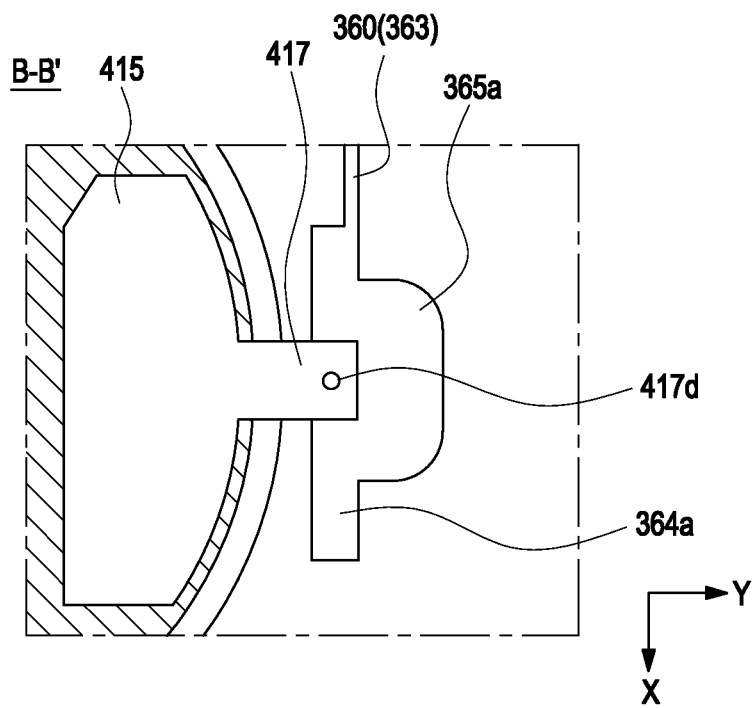
FIG. 12D is a diagram illustrating an electrode tap to which a structure for preventing separation of a soldering part is applied according to an embodiment of the disclosure.

FIG. 12D is a diagram illustrating an electrode tap to which a structure for preventing separation of a soldering part is applied according to an embodiment of the disclosure.

Referring to FIG. 12A, a battery 400 and a wearable electronic device 300 including the same according to an embodiment may prevent the first electrode tap 415 from being separated from the first soldering part 365a by a groove structure 417a formed at the first end 417 of the first electrode tap 415. According to an embodiment, the groove structure 417a formed in the first end 417 may have a shape recessed in a predetermined depth from the surface of the first end 417 in a direction (X-axis direction) perpendicular to the extending direction (Y-axis direction) of the first end 417.

Referring to FIGS. 12B and 12C, a battery 400 and a wearable electronic device 300 including the same according to another embodiment may prevent the first electrode tap 415 from being separated from the first soldering part 365a by protrusion structures 417b and 417c formed at the first end 417 of the first electrode tap 415. According to an embodiment, the protrusion structures 417b and 417c formed at the first end 417 may have a shape protruding a predetermined height from the surface of the first end 417 in a direction (X-axis direction) perpendicular to the extending direction (Y-axis direction) of the first end 41. For example, the protrusion structure 417b may be a rectangular protruding structure such that the first end 417 has a T-shape as a whole. As another example, the protrusion structure 417c may be a trapezoidal structure protruding from the first end 417 such that the first end 417 has a wedge shape as a whole.

Figure 13:
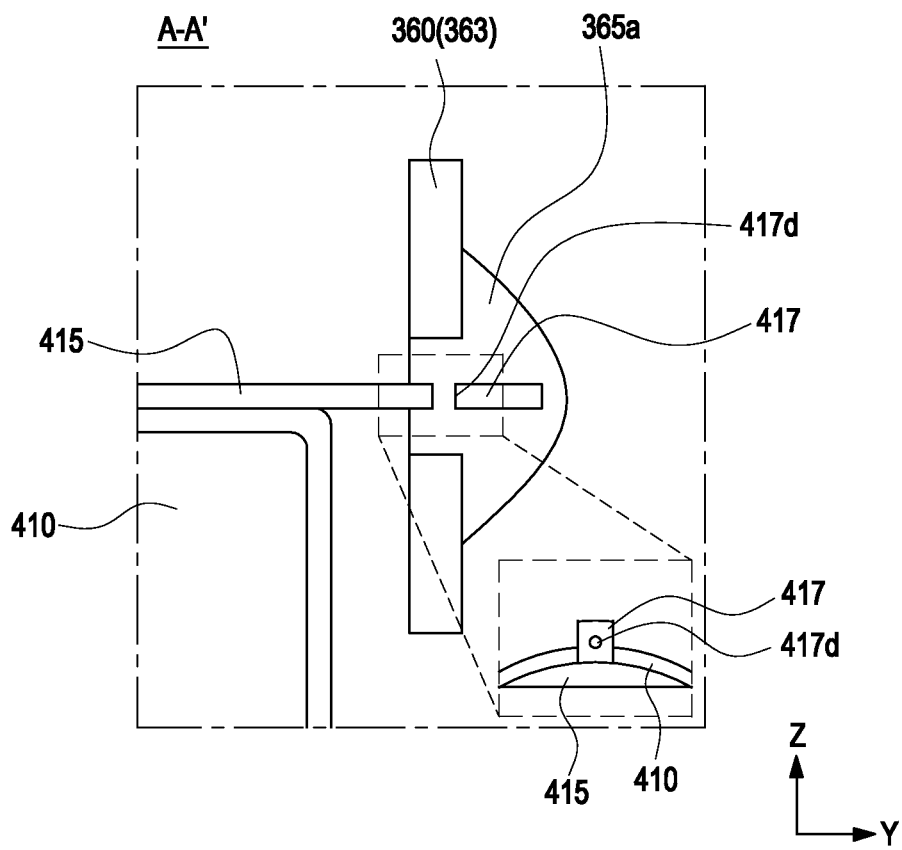
FIG. 13 is a diagram illustrating an electrode tap to which a structure for preventing separation of a soldering part is applied according to an embodiment of the disclosure.

FIG. 13 is a diagram illustrating an electrode tap to which a structure for preventing separation of a soldering part is applied according to an embodiment of the disclosure. FIG. 13 may illustrate a cross-section of an electrode tap to which a structure for preventing separation of a soldering part is applied, which is taken along the imaginary line A-A' of FIG. 11.

Referring to FIGS. 12D and 13, a battery 400 and a wearable electronic device 300 including the same according to another embodiment may prevent the first electrode tap 415 from being separated from the first soldering part 365a by a punch hole structure 417d formed at the first end 417 of the first electrode tap 415. According to an embodiment, the punch hole structure 417d formed in the first end 417 may be formed in the center of the first end 417, and if the solder introduced into the punch hole structure 417d during the soldering operation is solidified, the first electrode tap 415 and the first soldering part 365a may be firmly fixed according thereto.

The electronic device according to an embodiment may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that an embodiment of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with an embodiment of the disclosure, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

An embodiment as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to an embodiment, each component (e.g., a module or a program) of the above-described components may include a single entity or multiple entities, and some of the multiple entities may be separately disposed in different components. According to an embodiment, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to an embodiment, operations performed by the module, the program, or another component may be carried out sequentially, in parallel, repeatedly, or heuristically, or one or more of the operations may be executed in a different order or omitted, or one or more other operations may be added.

According to an embodiment of the disclosure, there may be provided an electronic device that includes a housing, a battery (e.g., the battery 400 in FIG. 6A) disposed in the inner space of the housing and including a first surface directed in a first direction, a second surface directed in a second direction different from the first direction, and a third surface directed in a third direction different from the first direction and the second direction, the first surface having a first electrode (e.g., the first electrode 410 in FIG. 6A) formed thereon and the second surface having a second electrode (e.g., the second electrode 420 in FIG. 7A) formed thereon a first electrode tap (e.g., the first electrode tap 415 in FIG. 6A) extending from the first surface of the battery so as to be at least partially parallel to the first surface, a second electrode tap (e.g., the second electrode tap 425 in FIG. 7A) extending from the second surface of the battery so as to be at least partially parallel to the second surface; and a printed circuit board (e.g., the second printed circuit board 360 in FIG. 6B) configured to connect the first electrode tap and the second electrode tap of the battery on the third surface (e.g., the third surface 400c in FIG. 6A), wherein soldering parts may be formed on a first surface of the printed circuit board, which is directed in a direction parallel to the third direction, to connect an end of the first electrode tap and an end of the second electrode tap, respectively, and wherein a solder flow control member (e.g., the solder flow control member 367 in FIG. 8B) may be formed on a second surface of the printed circuit board, which is directed in a direction opposite the third direction.

According to an embodiment, the printed circuit board may have a first opening into which the first electrode tap is inserted and a second opening into which the second electrode tap is inserted.

According to an embodiment, the solder flow control member may be formed to surround the second opening.

According to an embodiment, the solder flow control member may be formed of a material having higher thermal conductivity than the second electrode tap.

According to an embodiment, the first electrode tap and the second electrode tap may be formed of SUS (stainless steel), and the solder flow control member may be formed of a copper (Cu) material.

According to an embodiment, the electronic device may further include a peripheral member (e.g., the peripheral member in FIG. 6A) surrounding at least a portion of the third surface of the battery.

According to an embodiment, a heat-resistant tape (e.g., the heat-resistant tape 431 in FIG. 9A) may be formed at a position corresponding to the second electrode tap on one surface of the peripheral member.

According to an embodiment, the second electrode tap may include a first portion extending at least partially parallel to the second surface and a second portion extending at least partially parallel to the third surface.

According to an embodiment, the second electrode tap may include a protrusion in which an end of the second portion partially protrudes in a circumferential direction of the battery.

According to an embodiment, the protrusion may protrude in a direction perpendicular to a longitudinal direction of the second portion of the second electrode tap.

According to an embodiment, a pair of protrusions may be provided.

According to an embodiment, at least one of the end of the first electrode tap or the end of the second electrode tap may include a structure for preventing separation of a soldering part.

According to an embodiment, the printed circuit board includes a first printed circuit board disposed to be spaced a predetermined distance apart from the first surface of the battery and including a power management circuit configured to supply power used for the operation of the electronic device to at least one electronic component disposed inside the electronic device using the power of the battery, and a second printed circuit board electrically connected to the battery and disposed to surround at least a portion of the second surface and/or the third surface of the battery.

According to an embodiment, the second printed circuit board may be configured in the form of a flexible printed circuit board (FPCB).

According to an embodiment, the battery may be a coin-cell battery.

According to an embodiment, the electronic device may be a wearable electronic device including at least one speaker and/or at least one microphone inside the housing.

According to an embodiment of the disclosure, there may be provided a wearable electronic device that includes a housing, a battery disposed in the inner space of the housing and including a first surface directed in a first direction, a second surface directed in a second direction different from the first direction, and a third surface directed in a third direction different from the first direction and the second direction, the first surface having a first electrode formed thereon and the second surface having a second electrode formed thereon, a printed circuit board configured to connect a first electrode tap and a second electrode tap of the battery on the third surface, a first electrode tap extending on the first surface of the battery so as to be at least partially parallel to the first surface, a second electrode tap extending on the second surface of the battery so as to be at least partially parallel to the second surface, and a peripheral member surrounding at least a portion of the third surface of the battery, wherein soldering parts may be formed on a first surface of the printed circuit board, which is parallel to the third direction, to connect an end of the first electrode tap and an end of the second electrode tap, respectively, wherein a solder flow control member may be formed on a second surface of the printed circuit board, which is directed in a direction opposite the third direction, and wherein a heat-resistant tape may be formed at a position corresponding to the second electrode tap on one surface of the peripheral member.

According to an embodiment, the solder flow control member may be formed of a material having higher thermal conductivity than the second electrode tap.

According to an embodiment, the second electrode tap may include a first portion extending at least partially parallel to the second surface and a second portion extending at least partially parallel to the third surface.

According to an embodiment, the second electrode tap may include a protrusion in which an end of the second portion partially protrudes in a circumferential direction of the battery.

According to an embodiment, the battery may be a coin-cell battery.

According to an embodiment, the solder flow control member may comprise a first region formed by a conductive material exposed to an outside in an extension part of the printed circuit board, and the first region of the solder flow control member may comprise a higher thermal conductivity than a second region formed by the conductive material not exposed to the outside.

According to an embodiment, the peripheral member may be formed of a polycarbonate (PC) material, wherein the peripheral member may surround only the portion of the third surface of the battery, and wherein the third surface of the battery may correspond to a second portion of the second electrode tap, among outer surfaces of the battery.

According to an embodiment, a predetermined space may be provided between the first electrode and a rear surface of the printed circuit board, and the peripheral member may be disposed between the second electrode and the rear surface of the printed circuit board.

While the disclosure has been shown and described with reference to various embodiments thereof, it will be understood by those skilled in the art that various changes in form and details may be made therein without departing from the sprit and scope of the disclosure as defined by the appended claims and their equivalents.

What is claimed is:

1. An electronic device comprising:
a housing;
a battery disposed in an inner space of the housing, the battery comprising a first surface facing a first direction, a second surface facing a second direction different from the first direction, and a third surface facing a third direction different from the first direction and the second direction, a first electrode being disposed on the first surface and a second electrode being disposed on the second surface;
a first electrode tap extending from the first surface of the battery and being at least partially parallel to the first surface of the battery;
a second electrode tap extending from the second surface of the battery and being at least partially parallel to the second surface of the battery; and
a printed circuit board connecting the first electrode tap to the second electrode tap of the battery on the third surface of the battery,
wherein soldering parts are formed on a first surface of the printed circuit board, the first surface of the printed circuit board facing a direction parallel to the third direction, the soldering parts connecting an end of the first electrode tap to a first contact portion of the printed circuit board and an end of the second electrode tap to a second contact portion of the printed circuit board, respectively, and
wherein a solder flow control member is formed on a second surface of the printed circuit board, the second surface of the printed circuit board facing a direction opposite to the third direction.

2. The electronic device of claim 1, wherein the printed circuit board comprises a first opening into which the first electrode tap is inserted and a second opening into which the second electrode tap is inserted.

3. The electronic device of claim 2, wherein the solder flow control member surrounds the second opening.

4. The electronic device of claim 3, wherein the solder flow control member is formed of a material having higher thermal conductivity than the second electrode tap.

5. The electronic device of claim 4,
wherein the first electrode tap and the second electrode tap are formed of steel use stainless (SUS) stainless steel, and
wherein the solder flow control member is formed of a copper (Cu) material.

6. The electronic device of claim 1, further comprising:
a peripheral member surrounding at least a portion of the third surface of the battery.

7. The electronic device of claim 6, wherein a heat-resistant tape is disposed at a position corresponding to the second electrode tap on one surface of the peripheral member.

8. The electronic device of claim 1, wherein the second electrode tap comprises a first portion extending at least partially parallel to the second surface of the battery and a second portion extending at least partially parallel to the third surface of the battery.

9. The electronic device of claim 8, wherein the second electrode tap comprises a protrusion in which an end of the second portion partially protrudes in a circumferential direction of the battery.

10. The electronic device of claim 9, wherein the protrusion protrudes in a direction perpendicular to a longitudinal direction of the second portion of the second electrode tap.

11. The electronic device of claim 1, wherein at least one of the end of the first electrode tap or the end of the second electrode tap comprises a structure for preventing separation of a soldering part.

12. The electronic device of claim 1, wherein the printed circuit board comprises:
a first printed circuit board spaced apart by a predetermined distance from the first surface of the battery, the first printed circuit board comprising a power management circuit configured to supply power used for operating the electronic device to at least one electronic component disposed inside the electronic device using power of the battery; and
a second printed circuit board electrically connected to the battery and surrounding at least a portion of at least one of the second surface of the battery or the third surface of the battery.

13. The electronic device of claim 12, wherein the second printed circuit board comprises a flexible printed circuit board (FPCB).

14. The electronic device of claim 1, wherein the battery comprises a coin-cell battery.

15. The electronic device of claim 1, wherein the electronic device comprises a wearable electronic device including at least one of at least one speaker or at least one microphone inside the housing.

16. A wearable electronic device comprising:
a housing;
a battery disposed in an inner space of the housing, the battery comprising a first surface facing a first direction, a second surface facing a second direction different from the first direction, and a third surface facing a third direction different from the first direction and the second direction, a first electrode being disposed on the first surface and a second electrode being disposed on the second surface;
a first electrode tap extending from the first surface of the battery and being at least partially parallel to the first surface of the battery;
a second electrode tap extending from the second surface of the battery and being at least partially parallel to the second surface of the battery;
a printed circuit board connecting the first electrode tap to the second electrode tap on the third surface of the battery; and
a peripheral member surrounding at least a portion of the third surface of the battery,
wherein soldering parts are formed on a first surface of the printed circuit board, the first surface of the printed circuit board facing a direction parallel to the third direction, the soldering parts connecting an end of the first electrode tap to a first contact portion of the printed circuit board and an end of the second electrode tap to a second contact portion of the printed circuit board, respectively,
wherein a solder flow control member is disposed on a second surface of the printed circuit board, the second surface of the printed circuit board facing a direction opposite to the third direction, and
wherein a heat-resistant tape is disposed at a position corresponding to the second electrode tap on one surface of the peripheral member.

17. The wearable electronic device of claim 16, wherein the solder flow control member is formed of a material having higher thermal conductivity than the second electrode tap.

18. The wearable electronic device of claim 16, wherein the second electrode tap comprises a first portion extending at least partially parallel to the second surface of the battery and a second portion extending at least partially parallel to the third surface of the battery.

19. The wearable electronic device of claim 18, wherein the second electrode tap comprises a protrusion in which an end of the second portion partially protrudes in a circumferential direction of the battery.

20. The wearable electronic device of claim 16, wherein the battery comprises a coin-cell battery.

\* \* \* \* \*